United States Patent
Nabeshima et al.

(10) Patent No.: US 7,238,931 B2
(45) Date of Patent: Jul. 3, 2007

(54) DISPLACEMENT DETECTION APPARATUS

(75) Inventors: Nobuo Nabeshima, Kanagawa (JP); Kayoko Taniguchi, Kanagawa (JP); Eiko Kanbara, Kanagawa (JP)

(73) Assignee: Sony Corporation, Tokyo (JP)

( * ) Notice: Subject to any disclaimer, the term of this patent is extended or adjusted under 35 U.S.C. 154(b) by 60 days.

(21) Appl. No.: 11/109,911

(22) Filed: Apr. 19, 2005

(65) Prior Publication Data

US 2005/0236558 A1  Oct. 27, 2005

(30) Foreign Application Priority Data

Apr. 22, 2004 (JP) ............................. 2004-127205

(51) Int. Cl.
*G01D 5/245* (2006.01)
(52) U.S. Cl. .............................. 250/231.13; 250/237 G
(58) Field of Classification Search ................
250/231.1–231.19, 237 G
See application file for complete search history.

(56) References Cited

U.S. PATENT DOCUMENTS

| | | | | |
|---|---|---|---|---|
| 5,486,918 | A * | 1/1996 | Nagashima | 356/452 |
| 5,637,868 | A * | 6/1997 | Tamiya | 250/237 G |
| 5,959,295 | A * | 9/1999 | Braun | 250/237 G |
| 6,342,697 | B1 * | 1/2002 | Nagai et al. | 250/231.13 |
| 7,031,031 | B1 * | 4/2006 | Strasser | 358/474 |

FOREIGN PATENT DOCUMENTS

| | | |
|---|---|---|
| JP | 10-239105 | 9/1998 |
| JP | 2002-228412 | 8/2002 |

* cited by examiner

*Primary Examiner*—John R. Lee
(74) *Attorney, Agent, or Firm*—Robert J. Depke; Rockey, Depke, Lyons & Kitzinger LLC.

(57) ABSTRACT

The present invention provides a displacement detection apparatus uses short scales and can provide a long measurable range comparable to a single long scale with a short bed length. The displacement detection apparatus includes a scale, a first head and a second head adapted to detect periodic analog signals of a plurality of different types, a first processing section and a second processing section that detects the first differential value and the second differential value between the immediately preceding positional data and the current positional data obtained by sampling the periodic analog signals of a plurality of different types, a switching section that selectively switches from the first differential value to the second differential value or vice versa, a scale position detection section that detects the scale getting to a predetermined position relative to the first head or a predetermined position relative to the second head, a switching control section that causes the switching section to switch from either of the differential values to the other in response to the detection of the scale getting to the predetermined position, and an addition section that adds the first differential value or the second differential value selectively switched by the switching control section and outputting it as positional information.

19 Claims, 27 Drawing Sheets

| Low address | | | | | | | | | | | | | | | | |
|---|---|---|---|---|---|---|---|---|---|---|---|---|---|---|---|---|
| 16 | 3 | 3 | 2 | 1 | 1 | 0 | 0 | 3 | 3 | 2 | 2 | 1 | 1 | 0 | 0 | 0 |
| 15 | 3 | 3 | 2 | 1 | 1 | 0 | 3 | 3 | 2 | 2 | 1 | 1 | 0 | 0 | 0 | 3 |
| 14 | 3 | 3 | 2 | 1 | 1 | 0 | 3 | 2 | 2 | 1 | 1 | 0 | 0 | 0 | 3 | 3 |
| 13 | 3 | 3 | 2 | 1 | 0 | 3 | 3 | 2 | 2 | 1 | 0 | 0 | 0 | 3 | 3 | 2 |
| 12 | 3 | 3 | 2 | 1 | 0 | 3 | 2 | 2 | 1 | 1 | 0 | 0 | 3 | 3 | 2 | 2 |
| 11 | 3 | 2 | 1 | 1 | 0 | 3 | 2 | 1 | 1 | 0 | 0 | 3 | 3 | 2 | 2 | 1 |
| 10 | 3 | 2 | 1 | 0 | 3 | 2 | 2 | 1 | 0 | 0 | 3 | 2 | 2 | 2 | 1 | 1 |
| 9 | 3 | 2 | 1 | 0 | 3 | 2 | 1 | 0 | 0 | 3 | 2 | 2 | 1 | 1 | 1 | 0 |
| 8 | 3 | 2 | 1 | 3 | 2 | 1 | 0 | 0 | 3 | 2 | 2 | 1 | 1 | 1 | 0 | 0 |
| 7 | 3 | 2 | 0 | 3 | 2 | 0 | 0 | 3 | 2 | 1 | 1 | 1 | 0 | 0 | 0 | 3 |
| 6 | 3 | 1 | 0 | 2 | 0 | 0 | 3 | 2 | 1 | 1 | 0 | 0 | 0 | 3 | 3 | 3 |
| 5 | 3 | 1 | 3 | 1 | 0 | 2 | 1 | 1 | 0 | 0 | 3 | 3 | 3 | 3 | 2 | 2 |
| 4 | 3 | 0 | 1 | 0 | 2 | 1 | 0 | 0 | 3 | 3 | 2 | 2 | 2 | 2 | 2 | 2 |
| 3 | 3 | 3 | 0 | 1 | 0 | 3 | 3 | 2 | 2 | 2 | 2 | 1 | 1 | 1 | 1 | 1 |
| 2 | 3 | 0 | 0 | 3 | 2 | 2 | 1 | 1 | 1 | 1 | 1 | 0 | 0 | 0 | 0 | 0 |
| 1 | 0 | 0 | 0 | 0 | 0 | 0 | 0 | 0 | 0 | 0 | 0 | 0 | 0 | 0 | 0 | 0 |
| | 1 | 2 | 3 | 4 | 5 | 6 | 7 | 8 | 9 | 10 | 11 | 12 | 13 | 14 | 15 | 16 |

High address 2-bit value

FIG.15

Truth value table

| Quadrant | MSB SC | Low address | High address |
|---|---|---|---|
| I | 11 | SIN | COS |
| II | 10 | $\overline{COS}$ | SIN |
| III | 00 | $\overline{SIN}$ | $\overline{COS}$ |
| IV | 01 | COS | $\overline{SIN}$ |

Tab 1

FIG. 17

| Number of partitions | 16n | | 8(2n−1) | | 4(2n−1) | |
|---|---|---|---|---|---|---|
| Output | A | B | A | B | A | B |
| 1st quadrant | a | b | a | b | a | b |
| 2nd quadrant | a | b | $\bar{a}$ | $\bar{b}$ | b | $\bar{a}$ |
| 3rd quadrant | a | b | a | b | $\bar{a}$ | $\bar{b}$ |
| 4th quadrant | a | b | $\bar{a}$ | $\bar{b}$ | $\bar{b}$ | a |

FIG.18

DISPLACEMENT DETECTION APPARATUS

CROSS REFERENCE TO RELATED APPLICATIONS

The present invention contains subject matter related to Japanese Patent Application JP 2004-127205 filed in the Japanese Patent Office on Apr. 22, 2004, the entire contents of which being incorporated herein by reference.

BACKGROUND OF THE INVENTION

1. Field of the Invention

This invention relates to a displacement detection apparatus for detecting the relative position of a moving apparatus, which may be a machine tool, an inspection apparatus or a semiconductor manufacturing system.

2. Description of the Related Art

Displacement detection apparatus for detecting the relative position of a moving apparatus, which may be a machine tool or a semiconductor manufacturing system, are known. Such a displacement detection apparatus comprises a scale on which a periodic signal having a constant wavelength is recorded in a predetermined direction with a fluctuating signal level, a head section for detecting the periodic signal recorded on the scale and a processing section for processing the periodic signal detected by the head section and outputting positional information. The scale and the head section are fitted to respective members of a movable section and a reference section that are adapted to move relative to each other. With the displacement detection apparatus, the head section detects the periodic signal whose signal level fluctuates on the scale in response to the relative movement of the two members and supplies the detected periodic signal to the processing section. The processing section by turn outputs positional information that indicates the relative positions of the relatively moving two members according to the periodic signal detected by the head section.

Known displacement detection apparatus include those having a single scale and a single head section. FIGS. 1A through 1D of the accompanying drawings schematically illustrate a known displacement detection apparatus mounted on a machine tool that is driven to move linearly. On the machine tool, the single head 100 of the displacement detection apparatus is arranged in a central part of a bed 101, which is a stationary member, and vis-à-vis a scale 102, which will be described in greater detail hereinafter. The scale 102 is arranged longitudinally under a table 103, which is a movable member adapted to move linearly either in the direction of arrow A from left L to right R or in the direction of arrow B from right R to left L, and vis-à-vis the head 100. The scale 102 and the head 100 may be a magnetic scale and a magnetic modulation type magnetic head or an optical scale and an optical head.

FIG. 1A illustrates a situation where the table 103 is moved relative to the head 101 in the direction of arrow B and the scale 102 is located at its left marginal position. The head 100 is located vis-à-vis the right side end of the scale 102. FIG. 1B illustrates a situation where the table 103 is moving in the direction of arrow A and located vis-à-vis a central part of the bed 101 and hence the scale 102 is also located vis-à-vis a central part of the bed 102. Accordingly, the head 100 is located vis-à-vis the middle point of the scale 102. FIG. 1C illustrates a situation where the table 103 is moved further relative to the head 101 in the direction of arrow A and the scale 102 is located at its right marginal position. The head 100 is located vis-à-vis the left side end of the scale 102. FIG. 1D illustrates a situation where the scale 102 is located at its left marginal position relative to the head 100 as overlapped on a situation where the scale 102 is located at its right marginal position relative to the head 100. The bed 101 has a length (bed length: BL) twice as long as the measurable length ML of the scale 102.

Japanese Patent Application Laid-open Publication No. 10-239105 (Patent Document 1) discloses a displacement detection apparatus that is a magnetic scale apparatus formed by lining a plurality of magnetic scales and adapted to take out phase modulation signals by means of a pair of integrally incorporated magnetic transducers.

FIG. 2 schematically illustrates a magnetic scale apparatus as disclosed in the Patent Document 1. Referring to FIG. 2, a magnetic scale substrate 110 carries thereon a magnetic scale 111 realized by using a magnetic medium formed on a strip-shaped plate and a signal having a constant wavelength $\lambda$ is recorded on the magnetic scale 111. A magnetic transducer 112 formed by using a pair of magnetic modulation type magnetic heads is fitted to a bed and arranged vis-à-vis the magnetic scale 111.

Referring again to FIG. 2, another magnetic scale substrate 113 has a configuration similar to that of the magnetic scale substrate 110. A magnetic transducer 114 formed by using a pair of magnetic modulation type magnetic heads is fitted to a bed and arranged vis-à-vis the magnetic scale substrate 113. The two magnetic scale substrates 110 and 113 are linked to each other so as to be used as a long scale. The two magnetic transducers 112 and 114 are also integrated with each other to form a head section 115.

The pairs of magnetic heads of the two magnetic transducers 112 and 114 are supplied with an excitation signal from an excitation circuit 116. The pairs of magnetic heads of the two magnetic transducers 112 and 114 are connected respectively to a first detection circuit 117 and to a second detection circuit 118. Each of the first detection circuit 117 and the second detection circuit 118 detects the phase modulation signal taken out in response to the relative positional change of the corresponding magnetic transducer relative to the corresponding magnetic scale and carries out an interpolation process on the signal before outputting it. Output circuit 119 selectively outputs the output of one of the detection circuits to provide positional information.

FIG. 3 schematically illustrates the positional relationship of the scale substrates 110 and 113 and that of the magnetic transducers 114 and 112 of the head section 115 of the above described magnetic scale apparatus. Assume here that the head section 115 is moving rightward relative to the scale substrate 110. While both of the magnetic transducers 114 and 112 provide outputs in the illustrated position, the output of the magnetic transducer 112 is selected for use.

As the magnetic transducer 112 comes into the link section 120 of the two scale substrates 110 and 113, the output of the magnetic transducer 112 is reduced so that the output circuit 118 switches from the use of the output of the magnetic transducer 112 to the use of the output of the magnetic transducer 114.

As the two transducers move further and the magnetic transducer 114 comes into the link section 120, the output of the magnetic transducer 114 is reduced this time but the magnetic transducer 112 has already moved out of the link section 120 and recovered the output so that the output circuit 118 switches from the use of the output of the magnetic transducer 114 to the use of the output of the magnetic transducer 112.

In this way, the above described magnetic scale apparatus avoids signal degradation in the link section 120 by selecting the output of the transducer that is providing a good output.

SUMMARY OF THE INVENTION

Meanwhile, it is difficult to prepare the scale of a displacement detection apparatus having a single scale and a single head section as illustrated in FIGS. 1A through 1D because of the large length of the scale. The graduations of the scale are arranged at a very small pitch that corresponds to μm, nm or even pm. Therefore, in the case of a long scale, it is difficult to precisely mark graduations on a single scale. Additionally, the scale has to be made of a material that is hardly affected by the surrounding environment. This means that it is difficult to prepare a single long scale and arrange it on a table. When a single long scale is used, the bed has to be made twice as long as the measurable length of the scale. This means that, if the displacement detection apparatus is fitted to a machine tool, the latter is forced to have large dimensions.

On the other hand, a magnetic scale apparatus disclosed in the Patent Document 1 and described above by referring to FIG. 2 comprises a plurality of scales because the head section 115 is formed integrally with magnetic transducers 112 and 114. In other words, it has not been possible to arrange a single scale and a plurality of heads.

Additionally, the magnetic scale apparatus of the Patent Document 1 employs a phase modulation system, where the integrally formed head section 115 reads sine waves sin and cosine wave cos. Therefore, it is not possible to shorten the cycle of sampling the differential value. In other words, a modulation signal is formed and the quantity of movement is read by seeing the number of clocks that come into a phase shift. Therefore, it is not possible to realize a high resolution unless a very high clock frequency is used. While a very high clock frequency is required, it is not possible for a magnetic scale apparatus to realize such a high clock frequency. The impossibility of raising the clock frequency of clocks that come into a phase shift means the impossibility of reducing the cycle of sampling the amplitude of the phase shift. Then, such a magnetic scale apparatus is apt to be influenced by signal distortions.

Additionally, since the magnetic transducers of the magnetic scale apparatus as illustrated in FIG. 3 are switched for use from one to the other according to the signal levels detected by the magnetic transducers, a positional shift can take place at the time of switching the magnetic transducers because of disparity of comparative levels. From the ideal point of view, it is desirable that the graduations of the scales are marked completely linearly and highly precisely. If errors are involved, it is desirable that errors are distributed uniformly among the graduations. However, in reality, there is a disparity of graduation errors as illustrated in FIG. 4A. When a positional shift occurs when the magnetic transducers are switched under such circumstances, a difference of Δ is produced in the signal level when the relative moving direction of the head is inverted. Then, such a magnetic scale apparatus poorly provides reproducibility and can highly probably entail errors.

In view of the above identified circumstances, it is desirable to provide a displacement detection apparatus that uses short scales and can provide a long measurable range comparable to a single long scale with a short head length.

Also, it is desirable to provide a displacement detection apparatus that is not apt to be influenced by signal distortions and provides a long measurable range by means of a single scale, while minimizing the error that can arise at the time of switching.

Thus, while a displacement detection apparatus according to the invention uses short scales, it can provide a measurable length substantially equal to that of a conventional displacement detection apparatus that uses a long scale and hence it can use a short bed. In other words, the scales are lightweight and can be manufactured at low cost. Additionally, the scales are less liable to be stained by dirt and dust if compared with a long scale because they are short so that the reliability of the apparatus will be improved. It is easy to handle the scales so that the short scale is easily fitted to a table. Further, it is easy to manufacture the scales. The bed length can be shortened so that a machine tool and the like to which the displacement detection apparatus is fitted can be downsized.

Still additionally, a displacement detection apparatus according to the invention is less affected by distorted signals because it is adapted to detect a differential value within a wavelength of a scale signal by using a same high speed clock. Furthermore, switching errors can be reduced when an external switching signal is used.

BRIEF DESCRIPTION OF THE DRAWINGS

FIG. 15 is another schematic illustration of specific values of interpolation data in a quadrant;

FIG. 17 is a table illustrating the rule of inverting and interchanging sin data and cos data for the purpose of using the interpolation data of a quadrant for another quadrant;

FIG. 18 is a table illustrating the rule of inverting the interpolation data in a quadrant and interchanging them between phase A and phase B;

DETAILED DESCRIPTION OF THE PREFERRED EMBODIMENTS

Now, the present invention will be described in greater detail by referring to the accompanying drawings that illustrate preferred embodiments of the invention.

Figure 1A:
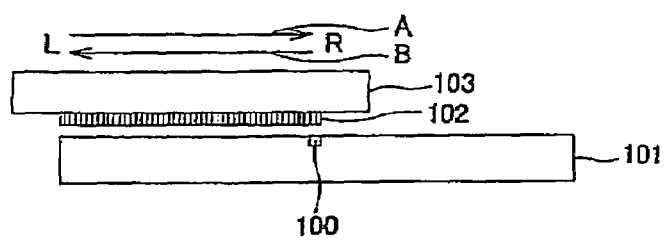
FIGS. 1A through 1D are schematic illustrations of a known displacement detection apparatus.
Figure 1B:
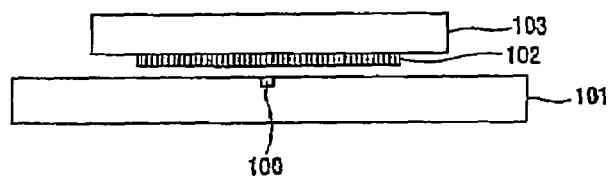
Figure 1C:
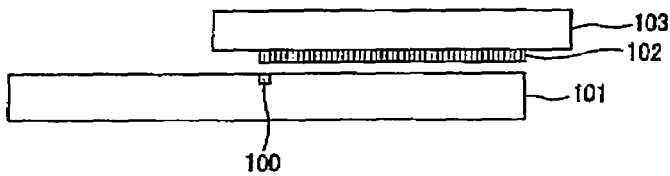
Figure 1D:
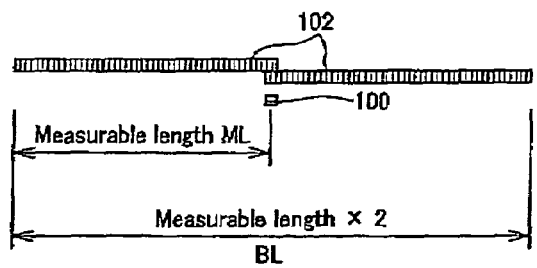
Figure 2:
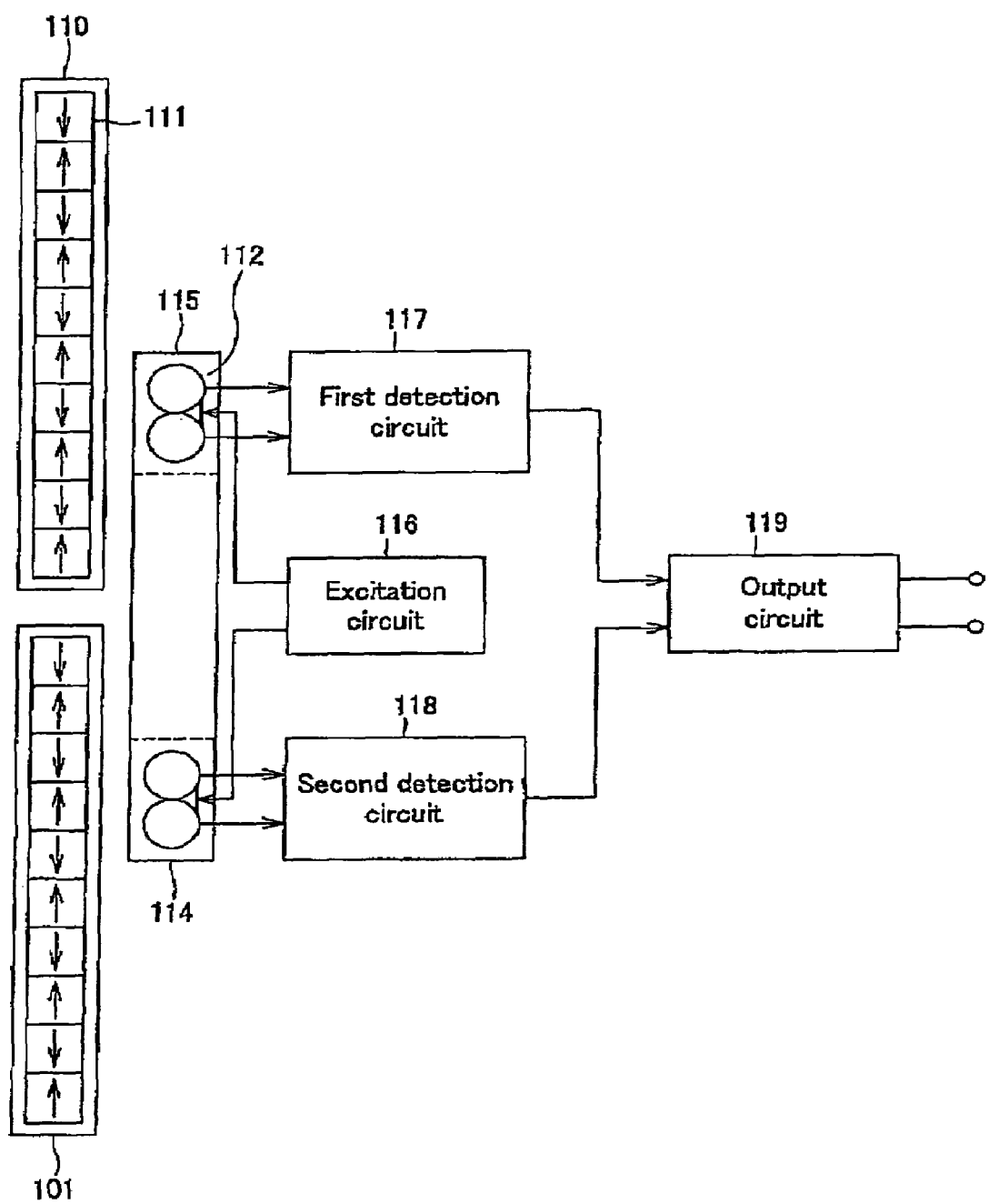
FIG. 2 is a schematic illustration of another known displacement detection apparatus.
Figure 3:
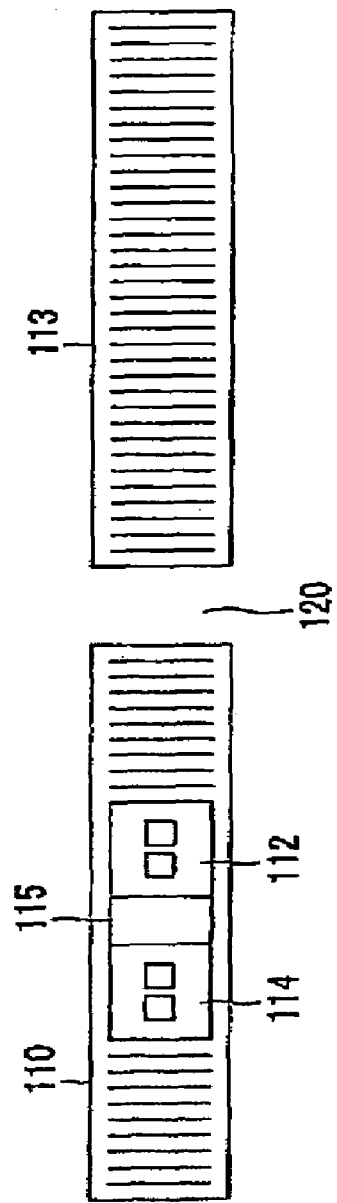
FIG. 3 is a schematic illustration of substantial parts of the known displacement detection apparatus of FIG. 2.
Figure 4A:
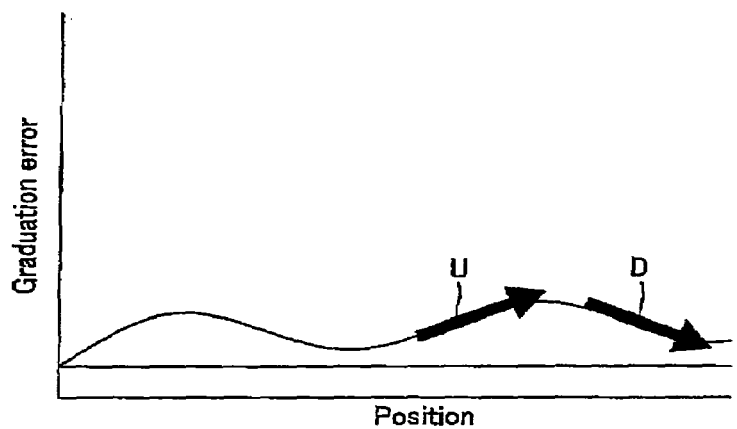
FIGS. 4A and 4B are graphs illustrating the problem of reproducibility of the known displacement detection apparatus of FIG. 2.
Figure 4B:
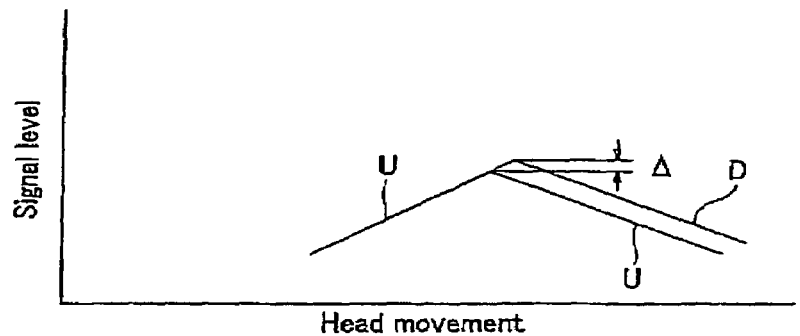
Figure 5:
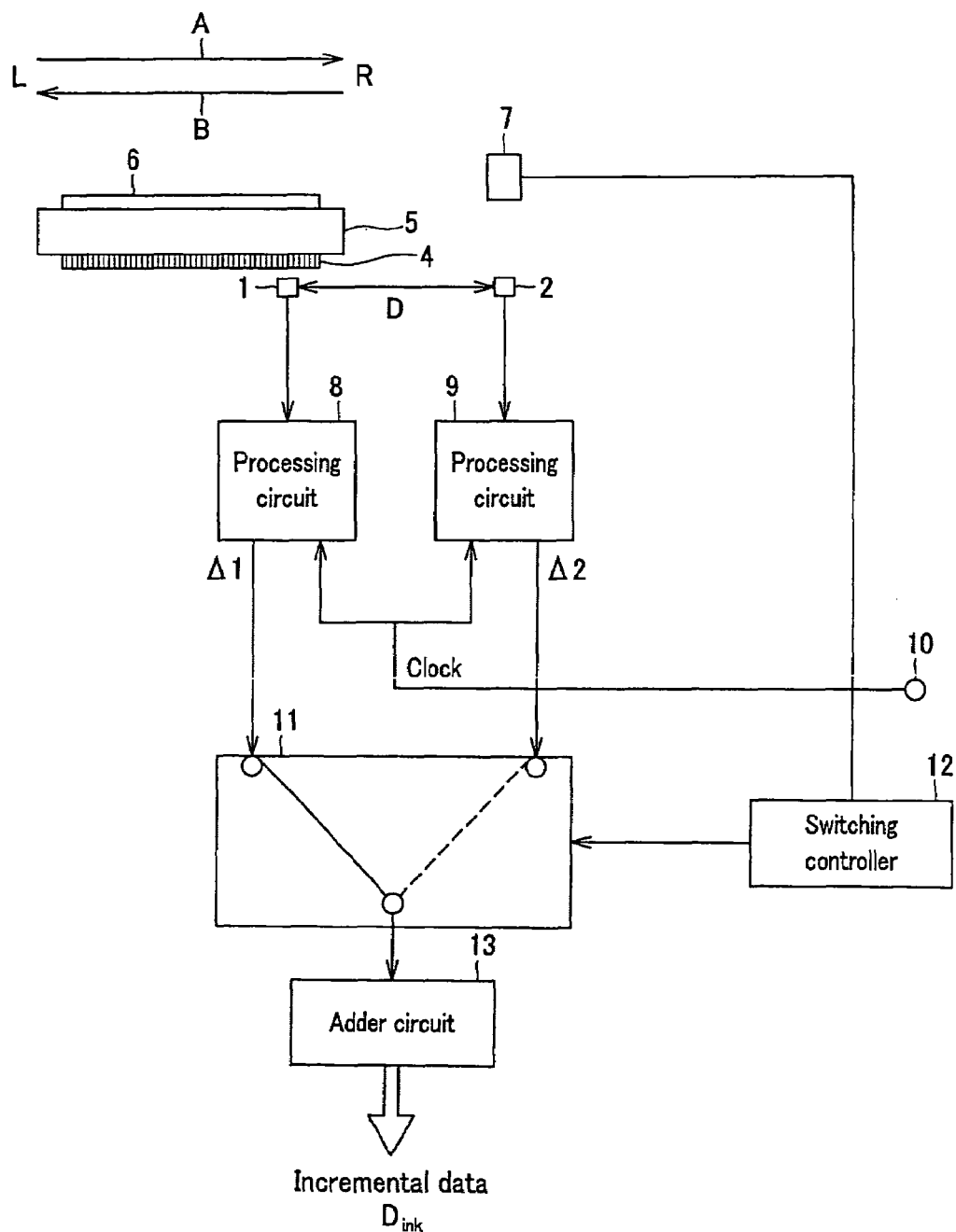
FIG. 5 is a schematic block diagram of the first embodiment of displacement detection apparatus according to the invention.

FIG. 5 is a schematic block diagram of the first embodiment of displacement detection apparatus according to the invention. FIGS. 6A through 6D are schematic illustrations of the relative positional relationship of the single scale and the two heads of the first embodiment of FIG. 5. As shown in FIGS. 5 and 6A through 6D, the first embodiment comprises a single scale 4, two heads 1 and 2 and a device for detecting the quantity of movement of a linear stage 5 by means of a switching sensor 7 and operates for feedback servo control. It is a displacement detection apparatus that can typically be used in the field of manufacturing semiconductors or liquid crystals for the purpose of measuring a quantity of movement in the order of nanometers (nm).

The two heads 1 and 2 of the displacement detection apparatus are arranged on a bed (the bed 3 in FIG. 6), which is a stationary section (reference section), opposite to a scale 4 and separated from each other by a predetermined gap D. The scale 4 is, on the other hand, fitted to a table 5 along the longitudinal direction of the latter, which is a movable section and adapted to linearly move from left L to right R in the direction indicated by arrow A or from right R to left L in the direction indicated by arrow B, so as to be vis-à-vis the heads 1 and 2.

The displacement detection apparatus highly precisely detects the displacement of an object of measurement by utilizing interference of diffracted light with an enhanced degree of resolution. The scale 4 may be a reflection type or transmission type diffraction grating typically formed by means of a hologram and adapted to decompose the obtained sine wave to the order of nm. The diffraction grating to be used for the scale 4 typically is in the form of a thin plate, on the surface of which slits or grooves are cut at predetermined intervals, or at a predetermined pitch, to produce a grating with distributed refractive indexes. However, the type of diffraction grating to be used for the scale 4 is not limited to the above-described one, or the type having mechanically cut grooves. For example, a diffraction grating may be formed on a plate of photosensitive resin by means of interference fringes obtained by baking.

Note that the scale 4 is formed by cutting graduations typically at a pitch of 4 μm or 138 nm on a thin plate of glass for the diffraction grating. The pitch of the graduations may be different from 138 nm and 4 μm so long as it is between these values. As a matter of fact, it is easy to prepare and handle a short scale rather than a long scale. Additionally, a long scale is costly. A short scale is less liable to be stained by dirt and dust. For these reasons, it is preferable to use a short scale rather than a long scale. Still additionally, it is possible to realize a compact apparatus by using a short scale.

Since the scale 4 is fitted to the table 5 along the longitudinal direction of the latter, which is adapted to linearly move from left L to right R in the direction indicated by arrow A or from right R to left L in the direction indicated by arrow B, so as to be vis-à-vis the heads 1 and 2, the head 1 and the head 2 can be displaced relative to the scale 4.

Figure 6A:
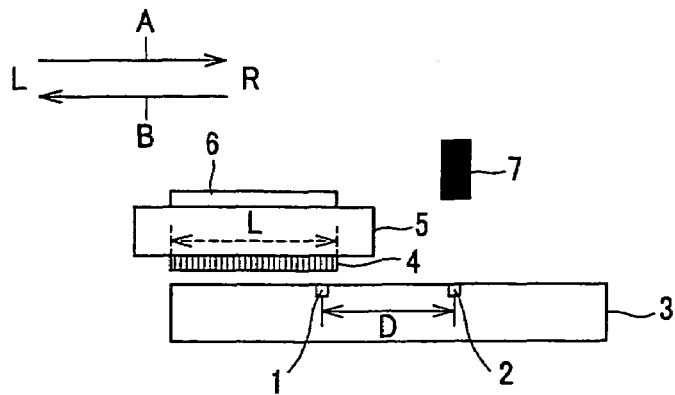
FIGS. 6A through 6D are schematic illustrations of the relative positional relationship of the single scale and the two heads of the first embodiment of FIG. 5.
Figure 6B:
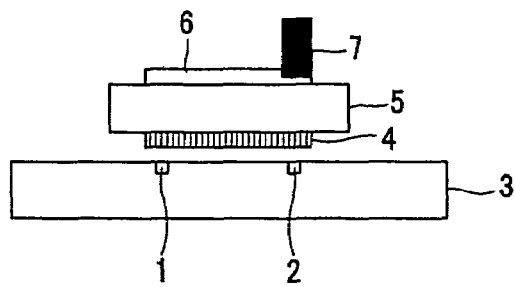
Figure 6C:
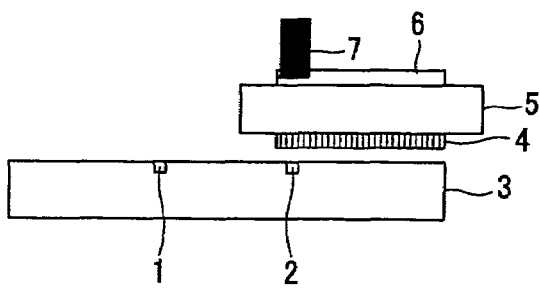
Figure 6D:
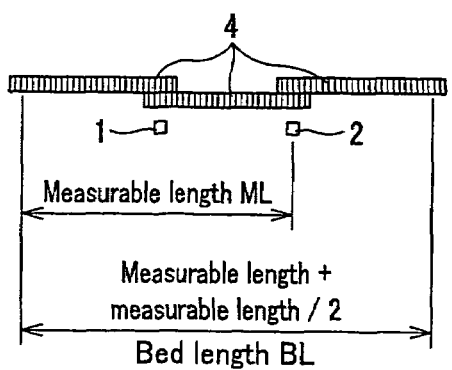
Figure 7A:
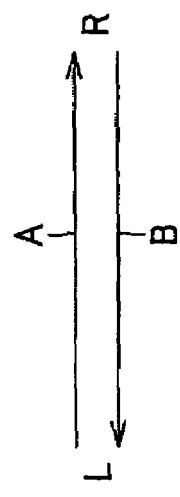
FIGS. 7A through 7C are schematic illustrations of the relative positions of the single scale and the two heads of the first embodiment of FIG. 5.
Figure 7B:
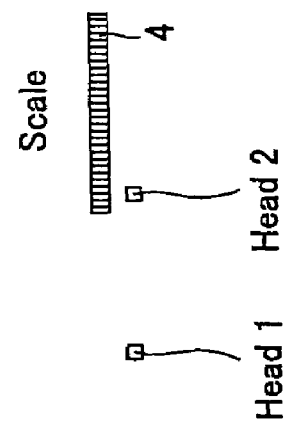
Figure 7C:
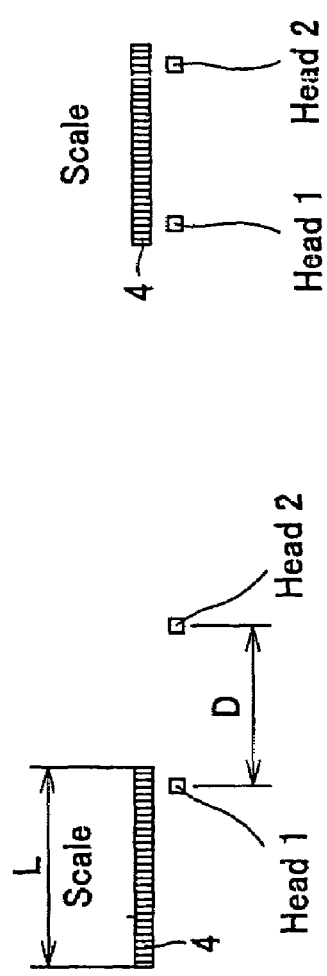

FIGS. 7A through 7C are schematic illustrations of the relative positions of the scale 4 and the heads 1 and 2 of the first embodiment. More specifically, FIG. 7A shows the left limit of the scale 4 and FIG. 7C shows the right limit of the scale 4. FIG. 7B shows a position of the scale 4 in which both the signal from the head 1 and the signal from the head 2 are effective. It will be appreciated that FIGS. 7A, 7B and 7C are respectively simplified versions of FIGS. 6A, 6B and 6C.

The gap separating the head 1 and the head 2 is made smaller than the length L of the scale 4 so that the differential value Δ1 and the differential value Δ2, which will be described in greater detail hereinafter, may be switched from one to the other in a situation as illustrated in FIG. 7B. Since the head 1 and the head 2 are displaceable relative to the scale 4, it is possible to detect periodic analog signals of a plurality of different types as a function of the graduations cut on the scale 4 at a predetermined pitch.

A periodic analog signal as used herein may refer to a sine wave sin or a cosine wave cos. Alternatively, it may be a plurality of sine waves sin or cosine waves cos. Optical heads are used for the head 1 and the head 2 in this embodiment.

As will be described in greater detail hereinafter, an optical head comprises a light source for emitting light, an optical system for dividing the beam of light emitted from the light source into two beams, causing two diffracted beams of light coming from the scale 4 to overlap and interfere with each other and reflecting the diffracted beams of light that are diffracted by the diffraction grating of the scale 4 and a photo-detector adapted to generate an interference signal by photoelectric conversion of the two diffracted beams interfering with each other.

Referring to FIG. 5, the periodic analog signals of a plurality of different types that the head 1 detects from the scale 4 are then supplied to the processing circuit 8. Similarly, the periodic analog signals of a plurality of different types that the head 2 detects from the scale 4 are supplied to the processing circuit 9.

The processing circuit 8 samples the periodic analog signals in synchronism with the clock supplied from clock terminal 10. The clock supplied from the clock terminal 10 is synchronized with the clock that is supplied to switching controller 12 and adder circuit 13, which will be described in greater detail hereinafter, and has a frequency sufficiently high relative to the resolution of an A/D converter, or the time that is required by the movable part of the machine tool, the position of which is to be detected, to move by the quantization unit of A/D conversion. For example, if it is specified that the machine tool, the position of which is to be detected, minimally requires 1 μsec to move by the quantization unit of A/D conversion, a sampling clock needs to have a frequency between 10 MHz and 20 MHz, or sufficiently higher than the above identified time.

The processing circuit 8 then detects differential data $\Delta 1$ on the difference between the positional data on the current position, or the current sampling data, and the last positional data on the last position, or the last sampling data. Similarly, the processing circuit 9 samples the periodic analog signals and then detects differential data $\Delta 2$ on the difference between the positional data on the current position and the last positional data on the last position, or the last sampling data. The differential data $\Delta 1$ and the differential data $\Delta 2$ are supplied to changeover switch 11.

A same high-speed clock is used for the operation of the processing circuit 8 of sampling the periodic analog signals and that of the processing circuit 9 of sampling the periodic analog signals. In other words, their respective positional data and differential values are of a same clock time. This means that errors can hardly occur by switching if incremental positional information $D_{ink}$ is used by adding the differential value of the head that is selected as a function of the state of an external switching detector, which will be described in greater detail hereinafter.

The changeover switch 11 selectively switches from the differential data $\Delta 1$ detected by the processing circuit 8 to the differential data $\Delta 2$ detected by the processing circuit 9 or vice versa. More specifically, the changeover switch 11 selectively switches from the differential data $\Delta 1$ to the differential data $\Delta 2$ or vice versa to follow the control operation of the switching controller 12. The switching controller 12 controls the switching operation of the changeover switch 11 according to the detection output of a scale position detector 7.

The scale position detector 7 is typically formed by using a photoelectric switch and adapted to output "L" when light emitted from the light emitting side thereof is blocked before it gets to the light receiving side thereof but output "H" when light emitted from the light emitting side is not blocked. A light shield plate 6 having a length exactly same as the scale 4 and arranged on the table 5 in FIG. 5 blocks light emitted from the light emitting side as the table 5 moves.

The scale position detector 7 may alternatively be formed by recording a specific hologram that indicates a reference position on the scale so that the scale position may be detected by detecting the hologram by means of the head 1 and/or the head 2. Still alternatively, the scale position detector 7 may be formed by recording a hologram of a wavelength of $\lambda 2$, which is different from the hologram wavelength $\lambda$ for increments, on the scale so that the scale position may be detected by detecting the hologram by means of the head 1 and/or the head 2 and by the differential value of $\lambda$ and $\lambda 2$. However, a scale position detector 7 comprising a photoelectric switch will be utilized in the following description.

Figure 8:
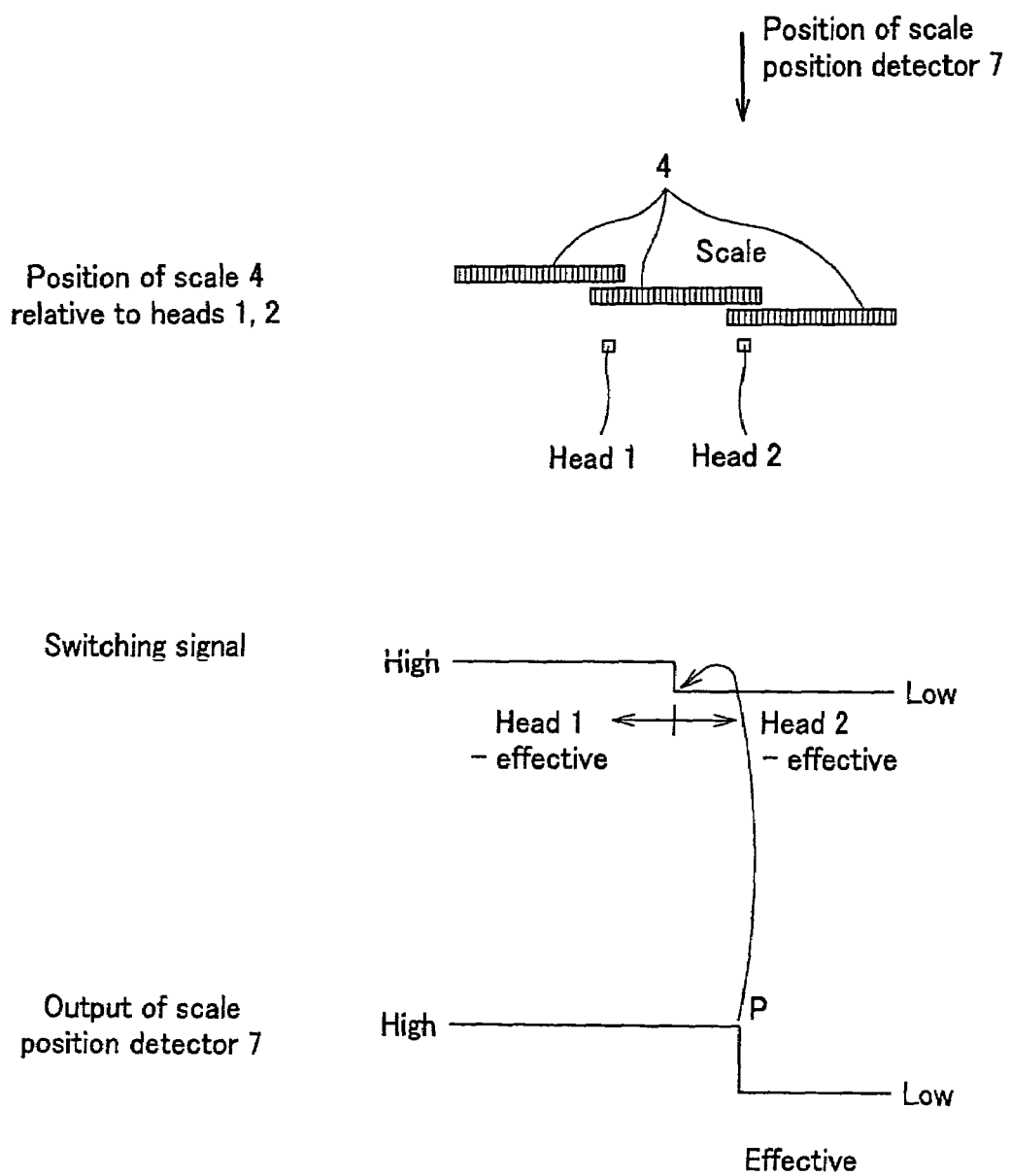
FIG. 8 is a schematic illustration of the switching control process of the switching controller of the first embodiment of FIG. 5.

FIG. 8 is a schematic illustration of the switching control process of the switching controller 12 for selectively adopting the differential data $\Delta 1$ or the differential data $\Delta 2$ according to the detection output of the scale position detector 7. The scale position detector 7 outputs "H" when light emitted from the light emitting side to the light receiving side is not blocked by the light shield plate 6, or when the state of FIG. 6A is present. The scale position detector 7 outputs "L" when light emitted from the light emitting side to the light receiving side is blocked by the light shield plate 6, or when the state of FIG. 6B is present.

When the scale 4 is in the position of FIG. 6B, the scale position detector 7 is anchored to the stationary part of the apparatus so that emitted light is blocked by the light shield plate 6. Therefore, the scale position detector 7 mechanically accurately detects the time when the head 1 and the head 2 that are separated from each other by a gap smaller than the length of the scale 4 are at the respective positions of FIG. 6B. In other words, it can detect the transitional time point P when the output of the scale position detector 7 changes from "H" to "L" as shown in FIG. 8 with an enhanced level of reproducibility. The transitional time point P is accurately detected by the switching controller 12.

At this time, the switching controller 12 supplies a switching signal as shown in FIG. 8 to the changeover switch 11. As a result, the changeover switch 11 can selectively switch from the differential data $\Delta 1$ detected by the processing circuit 8 to the differential data $\Delta 2$ detected by the processing circuit 9 or vice versa according to the detection output of the scale position detector 7.

Now, the operation of the first embodiment will be described in greater detail below. FIG. 6B illustrates a state where both the head 1 and the head 2 output periodic analog signals respectively to the processing circuit 8 and the processing circuit 9. At this time, the processing circuit 8 and the processing circuit 9 respectively output the differential data $\Delta 1$ and the differential data $\Delta 2$ to the changeover switch 11.

As described above, the scale position detector 7 supplies "H" to the switching controller 12 when light emitted from the light emitting side is received by the light receiving side without being blocked by the light shield plate 6. Therefore, when the scale 4 is moved in the direction of arrow A from the state as illustrated in FIG. 6A to the state as illustrated in FIG. 6B, the scale position detector 7 outputs "H" for a predetermined period of time as shown in FIG. 8 and then outputs "L".

As the scale 4 is moved further in the direction of arrow A, the scale position detector 7 continuously outputs "L" for a predetermined period of time as shown in FIG. 8 until the scale 4 comes into the state as illustrated in FIG. 6C from the state as illustrated in FIG. 6B. The predetermined period of time is determined as a function of the length and the moving speed of the scale 4. Therefore, once the scale 4 starts moving in the direction of arrow A as shown in FIG. 6A, the switching controller 12 can detect when the scale 4 comes into the state of FIG. 6B and also when the scale 4 comes into the state of FIG. 6C. It is also possible to detect the moving direction of the scale 4 by detecting the sequence according to which the scale position detector 7 outputs "H" and "L" for a predetermined period of time.

As the scale 4 starts moving in the direction of arrow B and comes into the state of FIG. 6A from the state of FIG. 6C, the output of the scale position detector 7 that is supplied to the switching controller 12 changes from "L" that continues for a predetermined period of time to "H" that also continues for a predetermined period of time. Thus, the switching controller 12 can detect the state of FIG. 6B when "L" is switched to "H". It is possible to detect the moving direction of the scale 4.

When the scale 4 is in the state of FIG. 6A when it starts moving in the direction of arrow A, only the head 1 detects periodic analog signals of a plurality of different types. Therefore, only the processing circuit 8 detects the differential value Δ1 and supplies it to the changeover switch 11. At this time, the switching controller 12 generates a switching signal according to "H" that the scale position detector 7 outputs in a manner as illustrated in FIG. 8 and supplies it to the changeover switch 11. The changeover switch 11 selects the differential value Δ1 from the processing circuit 8 and supplies it to the downstream adder circuit 13.

As the scale 4 is moved further in the direction of arrow A and comes into the state of FIG. 6B, both the head 1 and the head 2 output periodic analog signals respectively to the processing circuit 8 and the processing circuit 9. Then, the processing circuit 8 and the processing circuit 9 output respectively the differential data Δ1 and the differential data Δ2 to the changeover switch 11. At this time, the scale position detector 7 outputs "H" for a predetermined period of time and then "L" also for a predetermined period of time. As the switching controller 12 detects the transitional time point P (as shown in FIG. 8), when "H" is switched to "L", it supplies a switching signal to the changeover switch 11 for the change from "H" to "L". Then, the changeover switch 11 selects the differential value Δ2 from the processing circuit 9 and supplies it to the adder circuit 13.

Subsequently, only the head 2 detects periodic analog signals of a plurality of different types until the scale 4 comes into the state of FIG. 6C as it is moved further in the direction of arrow A. Thus, only the processing circuit 9 detects the differential value Δ2 and supplies it to the changeover switch 11. Since the changeover switch 11 is already turned to the side of the processing circuit 9 in the state of FIG. 6B, the differential value Δ2 is continuously supplied to the adder circuit 13.

In this way, as the scale 4 is moved in the direction of arrow A, the head 1 is made active between the state of FIG. 6A and the state of FIG. 6B so that consequently only the processing circuit 8 supplies the differential value Δ1 to the adder circuit 13. When the scale 4 comes into the state of FIG. 6B, the head 2 is activated so that consequently only the processing circuit 9 supplies the differential value Δ2 to the adder circuit 13.

The adder circuit 13 adds the differential value Δ1 or the differential value Δ2 that is selected and output from the switching controller 12 to the preceding differential values and outputs incremental positional information $D_{ink}$.

Figure 9:
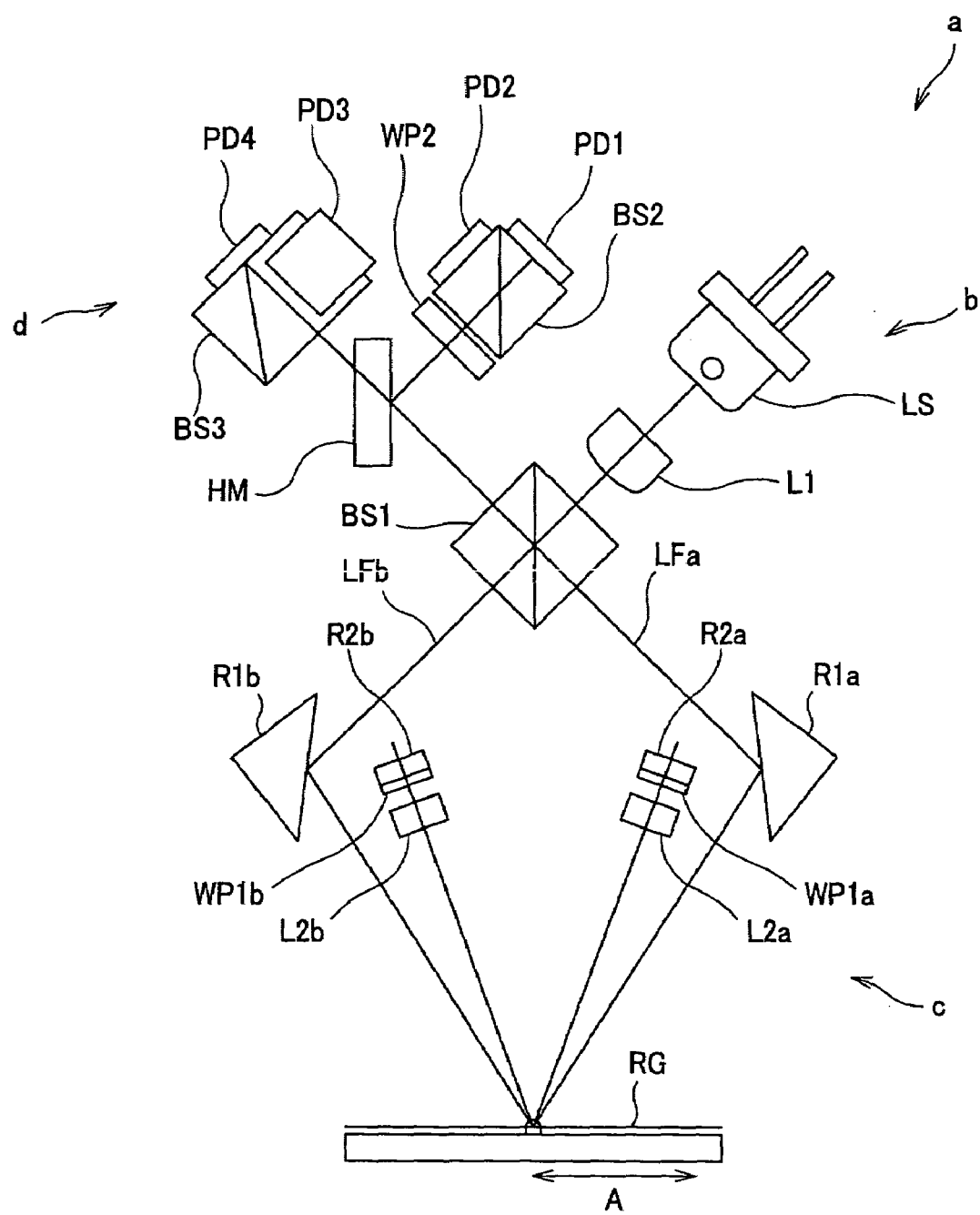
FIG. 9 is a schematic illustration of a head adapted to utilize interference of diffracted light that can be used for the first embodiment of FIG. 5.

Now, the embodiment of displacement detection apparatus of FIG. 5 will be described further by referring to FIGS. 9 through 21. FIG. 9 is a schematic illustration of an optical head that can be used for the head 1 and the head 2. It is adapted to utilize interference of diffracted light obtained by means of a diffraction grating.

The head can be roughly divided into three parts of a light irradiating section b, an optical path control and object of detection section c and a light receiving section d. More specifically, the light irradiating section b has a semiconductor laser (LS), a focusing lens (L1) and a polarization beam splitter (BS1) and the light path control and object of detection section c has reflection mirrors (R1a, R1b), a reflection type diffraction grating (RG), focusing lenses (L2a, L2b), λ/4 wave plates (WP1a, WP1b) and reflection mirrors (R2a, R2b), whereas the light receiving section d has a half mirror (HM), polarization beam splitters (BS2, BS3), a λ/4 wave plate (WP2) and photo-detectors (PD1 through PD4).

The beam of light emitted from the semiconductor laser LS, which is the light source, is turned into focused beam by the focusing lens L1 and polarized and divided into two beams (beam LF1, beam LFb) by the polarization beam splitter BS1, one of which is made to change its optical path by the reflection mirror R1a so as to get to the reflection type diffraction grating RG, while the other one is made to change its optical path by the reflection mirror R1b so as to get to the reflection type diffraction grating RG. The expression of "polarized and divided" refers to an operation of separating the incident beam into a P-polarized component and an S-polarized component.

At the reflection type diffraction grating RG annexed to the object of detection section (the linear scale and so on), each of the diffracted beams at least of the order higher than the primary order with a same (positive or negative) sign is made to pass through the focusing lens L2a or L2b and then its direction of polarization is turned by 90° by the λ/4 wave plate WP1a or WP1b, whichever appropriate. Then, the beam is reflected by the reflection mirror R2a or R2b, whichever appropriate, and follows the same optical path in the opposite direction to get to the polarization beam splitter BS1.

Each of the beams getting back to the polarization beam splitter BS1 is rotated by 90° relative to its original direction of polarization so that it is emitted in a direction different from the direction in which it enters the polarization beam splitter BS1 when it proceeds toward the diffraction grating RG to move toward the half mirror HM. Thus, the quantity of light of the light beam arriving at the half mirror HM is reduced to a half of the original quantity of light BS3. One of the beams produced by splitting the original beam gets to the polarization beam splitter, while the other beam passes through the λ/4 wave plate WP2 and gets to the polarization beam splitter BS2.

Note that the polarization beam splitter BS3 is fitted in position around its optical axis to take an attitude of being turned around its optical axis by 45° relative to the direction of polarization of the arriving beam.

The beams polarized and separated by the polarization beam splitter BS2 respectively get to the photo-detectors PD1 and PD2 and their intensities of light are converted into electric quantities. Similarly, the beams polarized and separated by the polarization beam splitter BS3 respectively get to the photo-detectors PD3 and PD4 and their intensities of light are converted into electric quantities.

The head 1 and the head 2 operate in a manner as described below. Firstly, the two beams of light LFa, LFb that are separated by the polarization beam splitter BS1 and show different respective directions of polarization are made to become diffracted beams having a same sign as they are reflected and diffracted by the reflection type diffraction grating RG and returned to the polarization beam splitter BS1 respectively by the λ/4 wave plates WP1a, WP1b and the reflection mirrors R2a, R2b as beams of light with the respective directions of polarization turned by about 90° relative to the directions of polarization with which they proceed to the diffraction grating RG before they are mixed at the polarization beam splitter BS1. Since the mixed two beams are split after being emitted from the light source LS having a same polarization component, they interfere with each other, although they are polarized in different directions of polarization.

Figure 10:
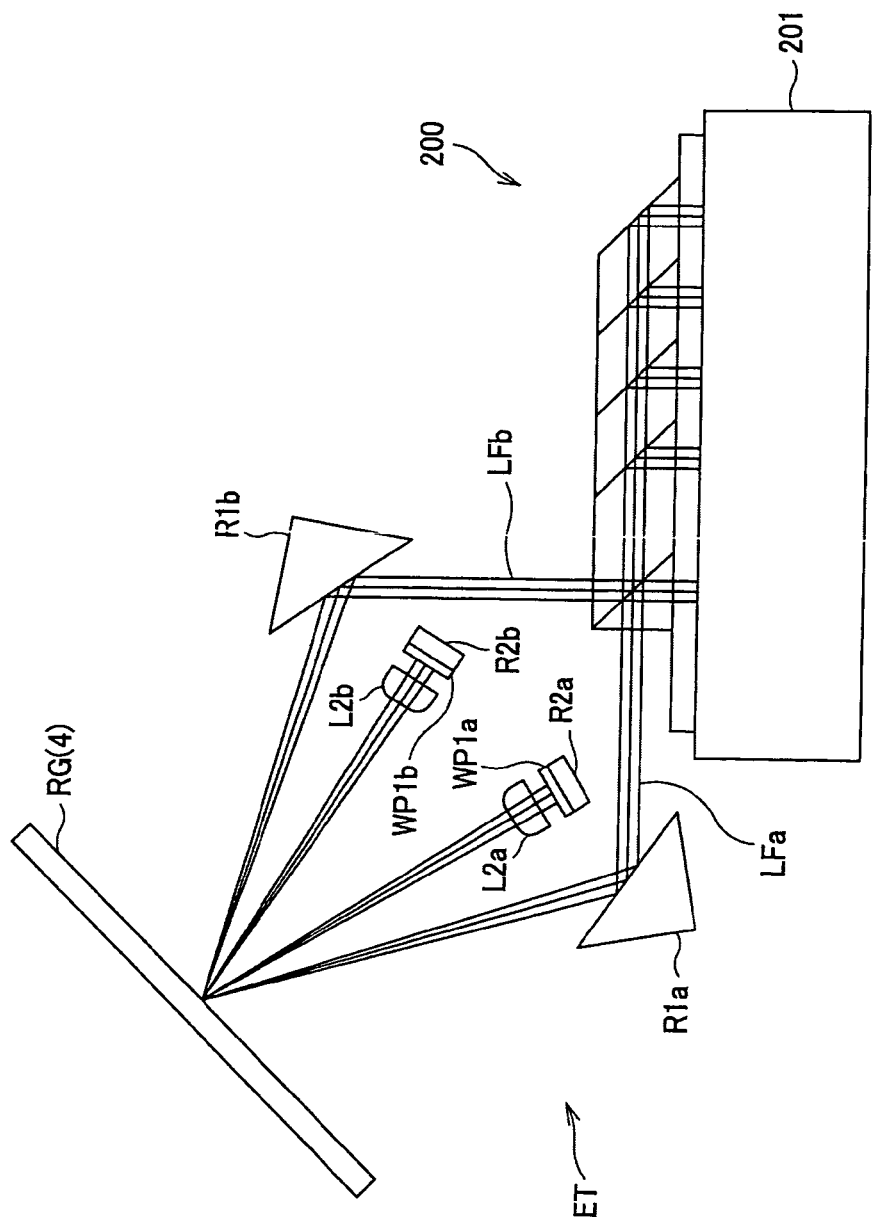
FIG. 10 is a schematic illustration of another head adapted to utilize interference of diffracted light that can be used for the first embodiment of FIG. 5.

A light receiving/emitting composite unit as shown in FIG. 10 may be used for the head 1 and the head 2. The light receiving/emitting composite unit can be applied to a grating interference type displacement detection apparatus as disclosed in Japanese Patent Application Laid-Open Publication No. 2002-228412.

As seen from FIG. 10, most of the components of the optical system are contained in the light receiving/emitting composite unit 200. The two beams of light LFa, LFb that are polarized and separated from each other in the unit and subsequently emitted to the outside respectively get to the first reflection members (reflection mirrors R1a, R1b) of external optical system ET and their optical paths are modified there. The reflection members are necessary for reflecting the beams of light emitted from the light receiving/emitting composite unit 200 toward the reflection type diffraction grating RG, which may typically be a hologram grating showing a high diffraction efficiency (e.g., three-dimensional phase hologram) that is used as the scale 4.

Each of the beams of light getting to the reflection type diffraction grating RG that is used as the scale 4 is then put into the grating at a short distance (in order to reduce the difference of optical path length in the grating and make the wavelength of the original signal hardly produce errors). Then, it is diffracted at least to the order higher than the primary order and made to get to the polarization member ($\lambda/4$ wave plate WP1a or WP1b) and the second reflection member (reflection mirror R2a or R2b, whichever appropriate) by way of the focusing lens L2a or L2b, whichever appropriate. More specifically, the beam of light LFa is diffracted by the reflection type diffraction grating RG and then gets to the reflection mirror R2a by way of the $\lambda/4$ wave plate WP1a, whereas the beam of light LFb is diffracted by the reflection type diffraction grating RG and then gets to the reflection mirror R2b by way of the $\lambda/4$ wave plate WP1b. Note that the $\lambda/4$ wave plates WP1a, WP1b take a role of changing the states of polarization of the respective diffracted beams of light, or turning the respective directions of polarization by 90°, whereas the reflection mirrors R2a, R2b take a role of reflecting the respective beams of light whose states of polarization are changed in the opposite directions. Thus, the reflected beams of light get to the light receiving/emitting composite unit 200, following the respective optical paths in the opposite directions (as return light heading for the unit). The light receiving/emitting composite unit 200 has an integrated structure produced by forming a light source, a light branching section and a light receiving section as a single member (see containing member 201).

Figure 11:
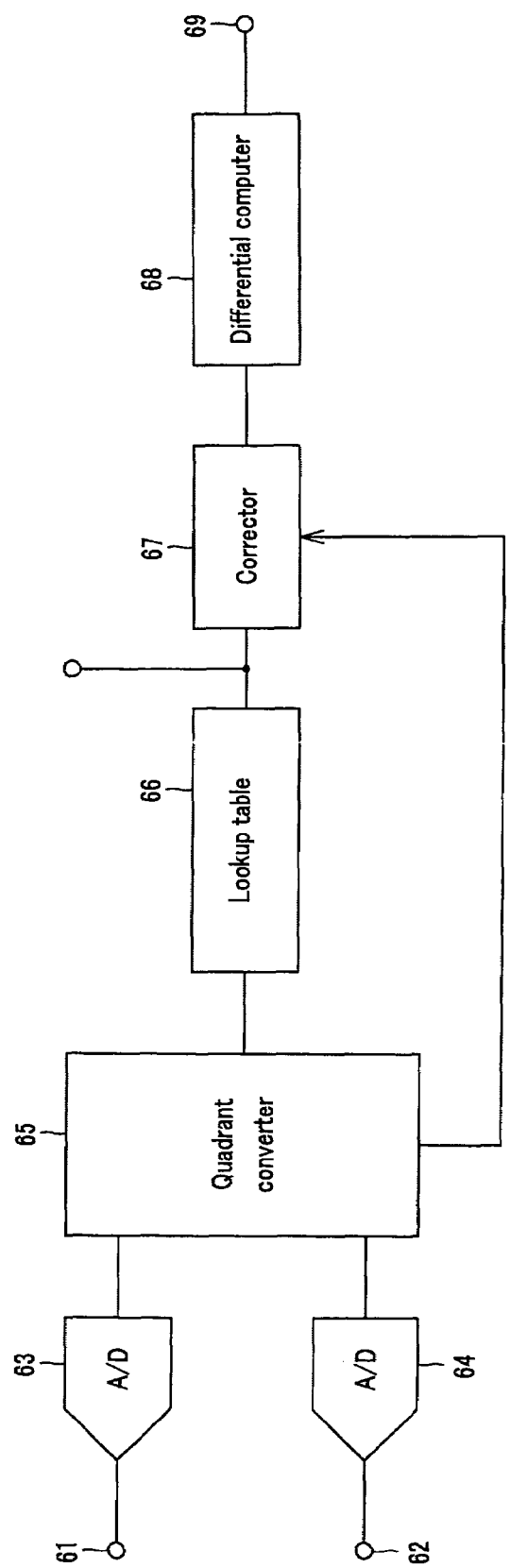
FIG. 11 is a schematic block diagram of the processing circuit of the first embodiment of FIG. 5.

FIG. 11 is a schematic block diagram of a processing circuit that can be used for both the processing circuit 8 and the processing circuit 9. The analog signals output from the head 1 are periodic signals with phases shifted by 90° from each other and showing a relationship of sine waves sin and cosine waves cos. The processing circuit 8 samples the amplitude values of the analog signals input to it from the head 1 by way of input terminal 61 and input terminal 62 and digitizes them at A/D converter 63 and A/D converter 64 by means of a high speed clock. Then, it supplies the digitized signals to the quadrant converter 65. The quadrant converter 65 divides a cycle of each of the digitized signals into four quadrants on the basis of the most significant bits of the signal values of the signals and identifies the quadrant into which the bits falls. Then, it addresses by using the other bits and reads out the interpolation data for the quadrant from a lookup table 66. Subsequently, it interchanges and inverts data values so as to make them match the corresponding quadrant by using a corrector 67 and transmits the corrected output to differential computer 68. The differential computer 68 detects the differential data $\Delta 1$ on the difference between the positional data on the current position and the last positional data on the last position, or the last sampling data, by using the corrected output.

Figure 12:
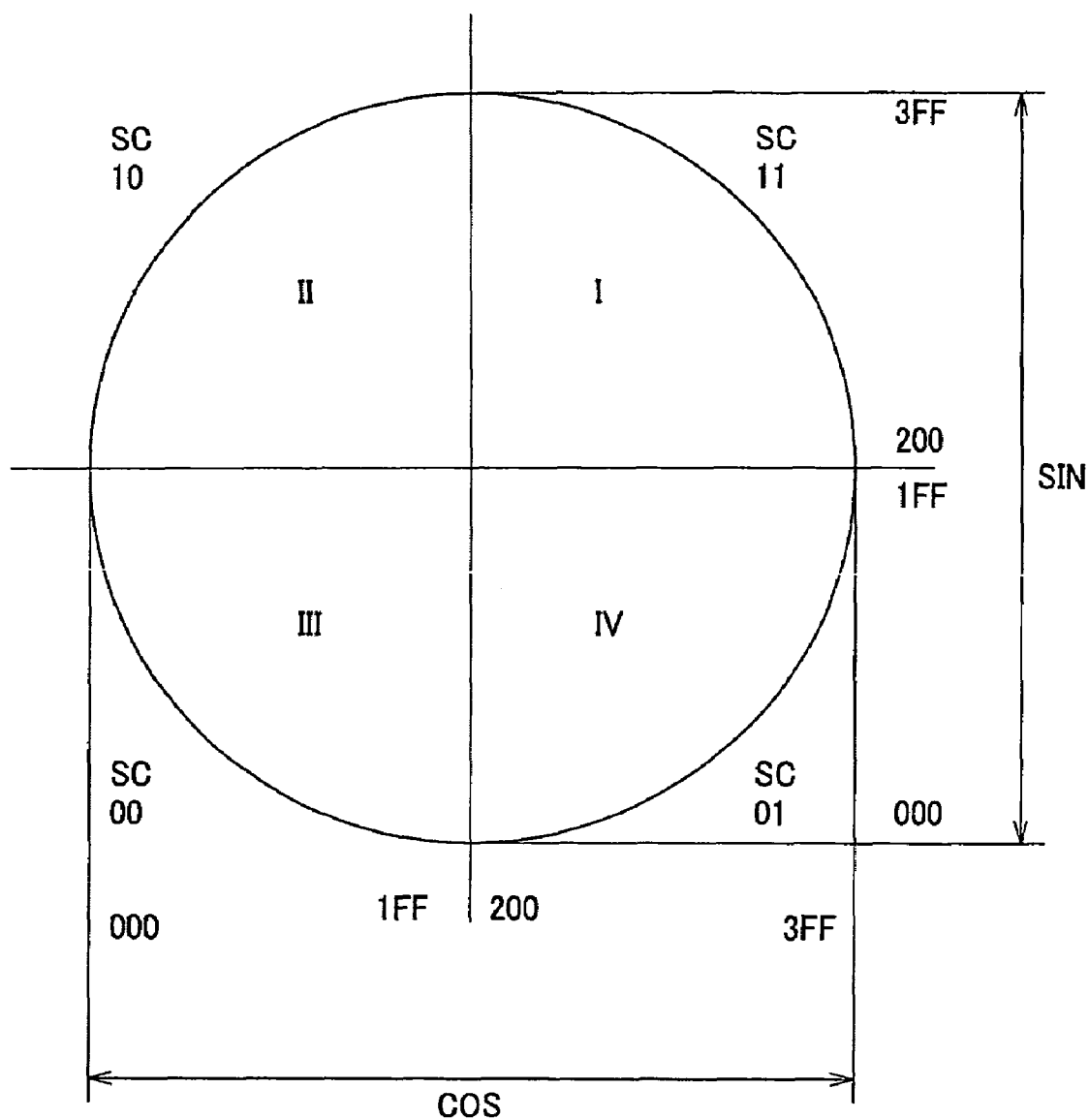
FIG. 12 is a schematic illustration of a periodic signal that can be defined by a sine wave and a cosine wave.

FIG. 12 is a schematic illustration of a periodic signal that can be defined by a sine wave and a cosine wave. In the graph of FIG. 12, a circle is drawn around the origin of the x, y coordinate system, where the horizontal axis is the x-axis and the vertical axis is the y-axis. If the radius of the circle is r and the rotary angle is $\omega$, there are relationships of $y = r \sin \omega t$ and $x = r \cos \omega t$.

Therefore, the horizontal axis represents the sine value and the vertical axis represents the cosine value.

In FIG. 12, I, II, III and IV respectively denote the first quadrant, the second quadrant, the third quadrant and the fourth quadrant. Since the quadrant I and the quadrant II are symmetrical respectively relative to the quadrant IV and the quadrant III as viewed from the x-axis, the arcs of the symmetrical quadrants have same x values. Similarly, since the quadrant I and the quadrant IV are symmetrical respectively relative to the quadrant II and the quadrant III as viewed from the y-axis, the arcs of the symmetrical quadrants have same y values.

Thus, as shown in FIG. 12, it is possible to limit the x values in the quadrants II and III between 000 and 1FF and those in the quadrants I and IV between 200 and 3FF and also limit the y values in the quadrants IV and III between 000 and 1FF and those in the quadrants I and II between 200 and 3FF.

By comparing the x, y values in the quadrant I and those in the quadrant II, it will be seen that the y values are found to be between 200 and 3FF both in the quadrant I and in the quadrant II and that the x values in the quadrant I are found to be between 200 and 3FF while those in the quadrant II are found to be between 000 and 1FF. Therefore, all the bits are same and found within the range between (000 and 1FF) except the most significant bit so that the quadrant II can be replaced by the quadrant I.

Figure 13:
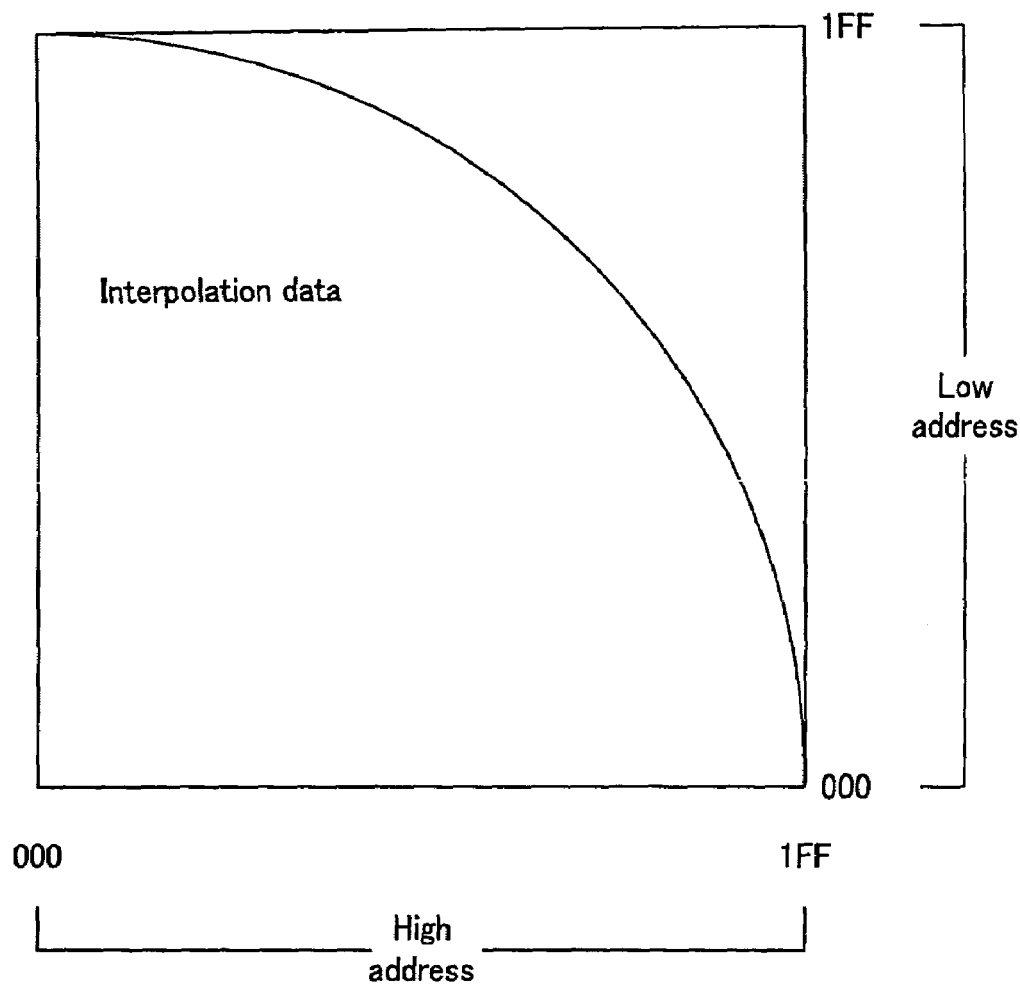
FIG. 13 is a graph showing the correspondence of a quadrant and digital codes.

Similarly, by comparing the x, y values in the quadrant III and those in the quadrant IV, it will be seen that the x values are found to be between 000 and 1FF and the y values are found to be between 000 and 1FF in the former quadrant, whereas the x values are found to be between 200 and 3FF and the y values are found to between 000 and 1FF in the latter quadrant. Therefore, these quadrants can be replaced by the quadrant I. FIG. 13 is a graph showing the correspondence of the representative quadrant and digital codes.

Figure 14:
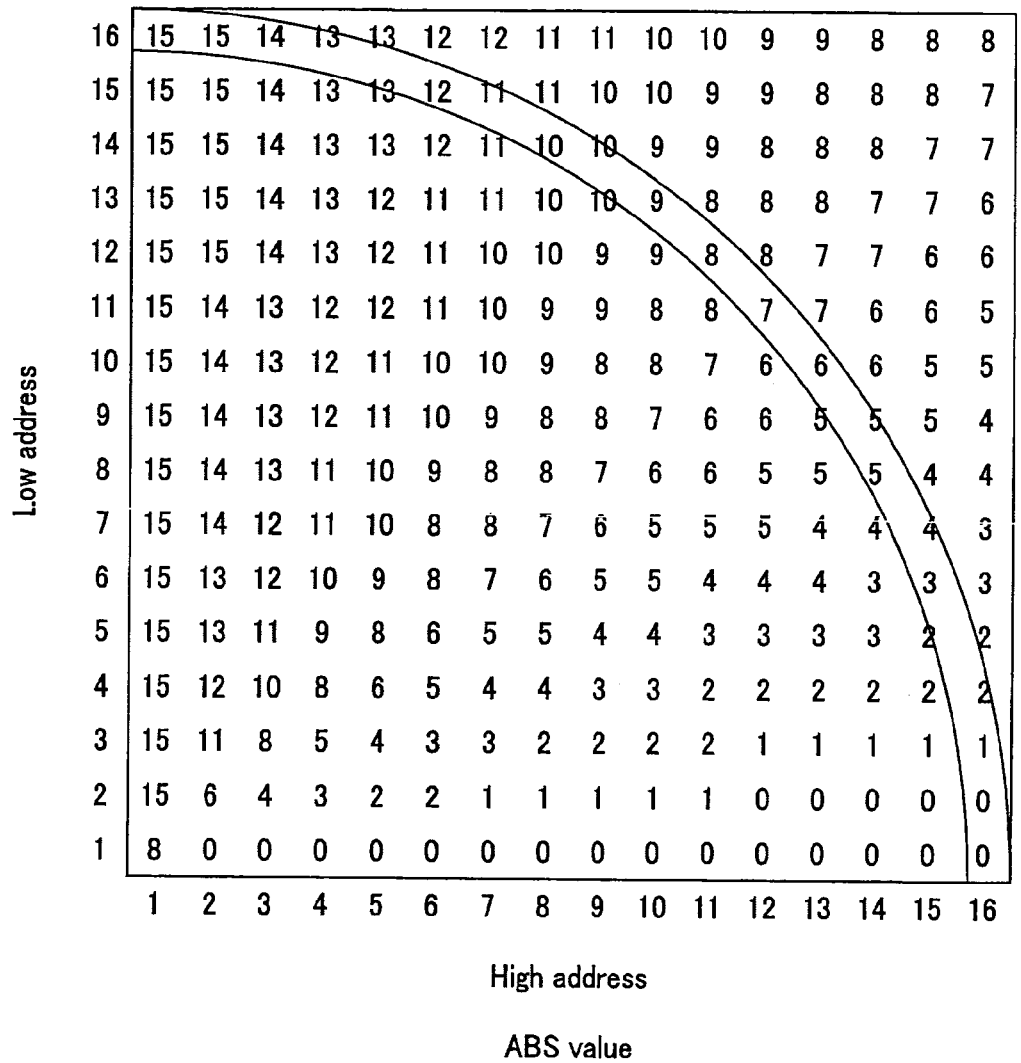
FIG. 14 is a schematic illustration of specific values of interpolation data in a quadrant.

FIG. 14 is a schematic illustration of specific values of interpolation data in the representative quadrant of FIG. 13 and FIG. 15 is another schematic illustration of specific values of interpolation data in the representative quadrant. FIG. 14 illustrates a case of A/B phases and FIG. 15 illustrates a case of 2-bit grey codes. Since the illustrated numerical values are not essential for the purpose of the present invention, they will not be described any further and the schematic illustration of FIG. 13 will be used in the following description.

In the quarter of a circle illustrated in FIG. 13, the address values increase from left to right and bottom to top. Therefore, the arrangement can be used for the quadrant I without modifications. However, the values stored in the ROM cannot be used without modifications for the quadrant II. In other words, they have to be converted in a manner as described in FIGS. 16A through 16D.

Figure 16A:
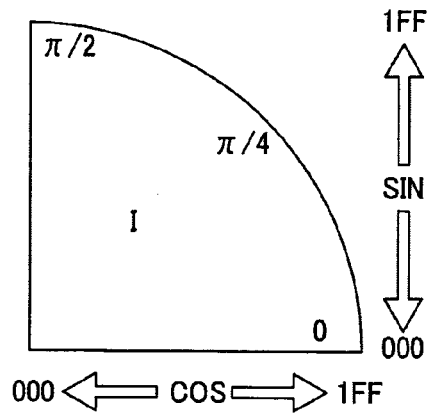
FIGS. 16A through 16D are schematic illustrations of a conversion in a quadrant.
Figure 16B:
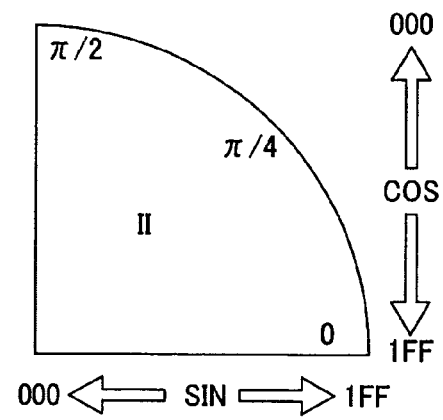
Figure 16C:
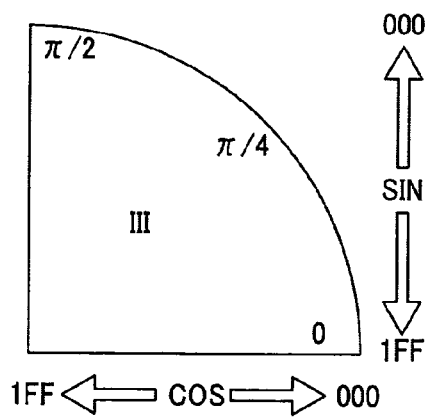

FIG. 16A shows the basic data stored in the ROM. If they are used for the quadrant I, the quadrant II becomes equivalent with the quadrant I when it is turned clockwise by 90° as shown in FIG. 16B. However, the values are so arranged as to increase from top to bottom along the vertical axis so that they have to be inverted. Additionally, while the horizontal axis represents cosine and the vertical axis represents sine in FIG. 16A, the horizontal axis represents sine and the vertical axis represents cosine in FIG. 16D. Therefore, they have to be interchanged. Now, the quadrant III becomes equivalent with the quadrant I when it is turned by 180° as shown in FIG. 16C. However, the values are so arranged as to increase inversely both along the vertical axis and along the horizontal axes relative to FIG. 16A so that they have to be inverted.

Figure 16D:
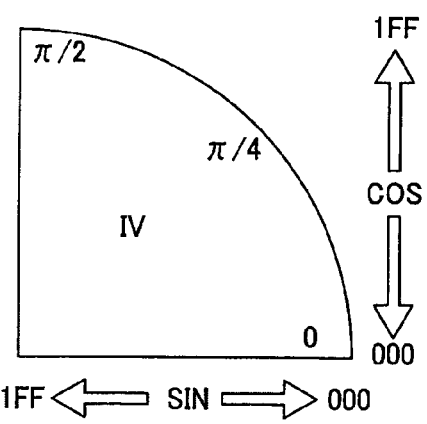

The quadrant IV becomes equivalent with the quadrant I when it is turned clockwise by 270° as shown in FIG. 16D. However, the values are so arranged as to increase inversely relative to the values in FIG. 16A so that they have to be inverted. Additionally, while the horizontal axis represents cosine and the vertical axis represents sine in FIG. 16A, the horizontal axis represents sine and the vertical axis represents cosine in FIG. 16B. Therefore, they have to be interchanged. While the numerical values in the quadrants are described above in terms of absolute values, the most significant bits are used as sign bits for discriminating the four quadrants.

FIG. 17 is a table illustrating the rule of inverting and interchanging sin data and cos data for the purpose of using the interpolation data of a quadrant for another quadrant. In FIG. 17, sc represents the most significant bits of sine and cosine, which are 11, 10, 00 and 01 respectively for the quadrants I, II, III and IV. The values with lines on top in the columns of low address and high address are complementary values (inverted values).

The specific processing circuit 8 whose block diagram is illustrated in FIG. 11 is designed to substitute the interpolation data of a cycle (360°) of sine and cosine by the data of a ¼ of a cycle (90°). As an example, assume that the data length of sine data and that of cosine data are 10 bits without sign and imagine a Lissajous figure that is drawn by arranging the data on the x, y plane (see FIG. 12). The most significant bits of sine data and cosine data are used for the purpose of substituting all the quadrants other than the first quadrant by the latter on the Lissajous figure (see FIG. 13). Then, the data except the most significant bits of sine data and cosine data are inverted when the most significant bit is equal to 0 and sine data and cosine data are interchanged in each even numbered quadrant so as to make the sense of increasing data values in each quadrant agrees with that of increasing data values in the first quadrant and allocate the data to the low addresses and the high addresses of the lookup table ROM for the first quadrant.

Since the data length is 10 bits (000 through 3FF) in this instance, the lower order nine bits (000 through 1FF) are inverted and will be interchanged depending on the status quo of the most significant bit (see FIG. 16). FIG. 18 is a truth table of this example. The relationship between the interpolation data of the lookup table ROM and the low address/the high address is expressed by either of the formulas below. Note that, while the X-axis and the Y-axis are used respectively for high addresses and low addresses in this instance, they may be used in the other way.

interpolation data=arctan(low address/high address)· number of interpolations/2π, where low address≧high address, or interpolation data=number of interpolations/4−arctan (high address/low address)/number of interpolations/2π, where low address<high address.

The interpolation data that can be obtained under the above identified conditions are such that only data of 0 through ¼ cycle period are output four times in a full rotation of a cycle period. In other words, it is only necessary to add the offsets for each quadrant in order to obtain data for a cycle period.

Figure 19:
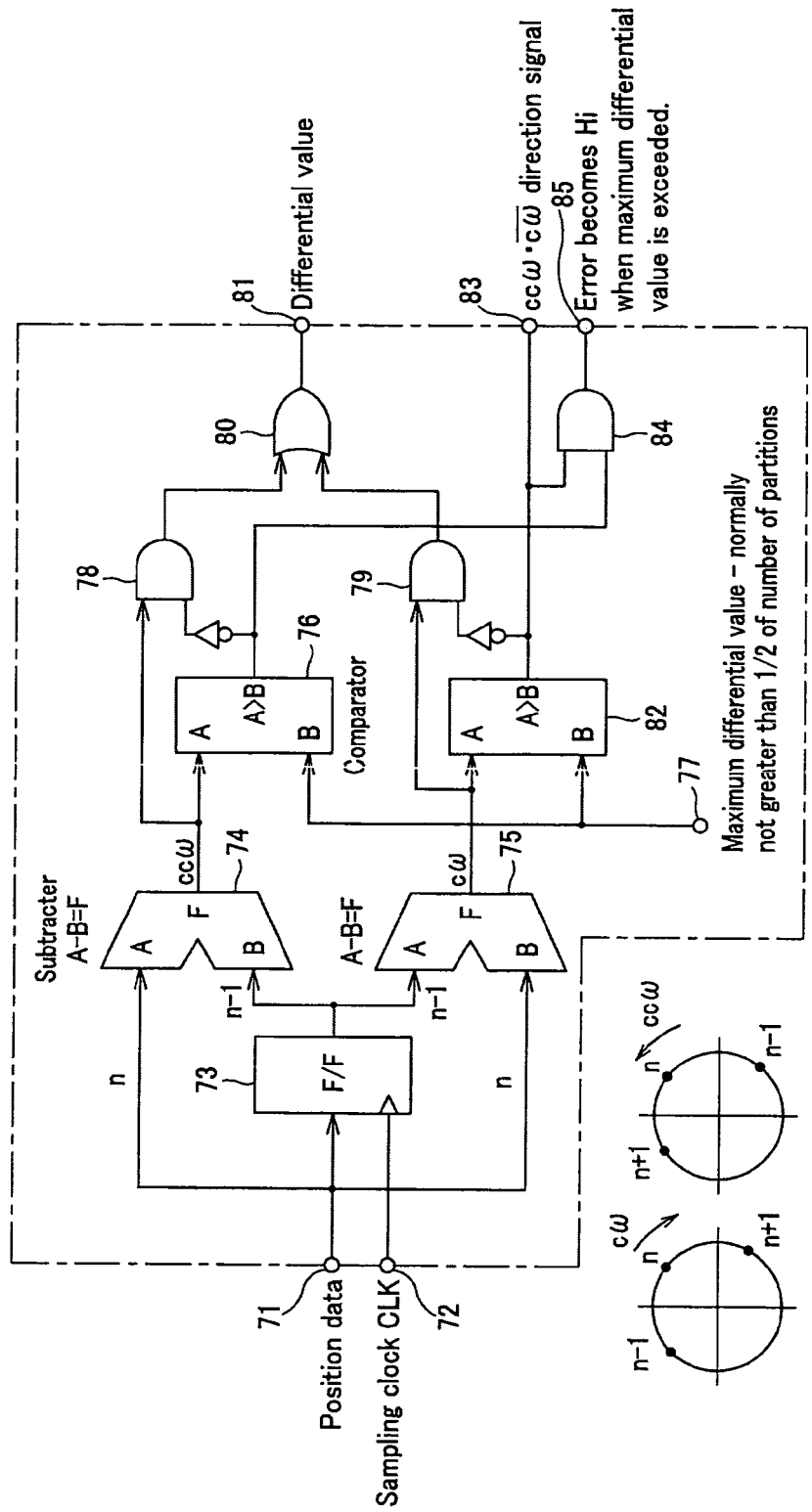
FIG. 19 is a schematic circuit diagram of a differential computer that can be used for the first embodiment of FIG. 5.

FIG. 19 is a circuit diagram of the differential computer 68 for computing the differential value Δ1. The data of a cycle period that are sampled in the current sampling session are held in the computer 68, which then computes the difference between the sampled data and the data sampled in the last sampling session by subtraction. Then, the computer 68 produces the obtained differential value. Referring to the circuit diagram of FIG. 19, the input positional data are supplied to a terminal 71 and taken into flip-flop F/F 73 according to the sampling clock that is supplied to a terminal 72. Thus, the output of the F/F 73 is the data of the last sampling session.

The data value of the last sampling session is subtracted from that of the current sampling session by a subtracter 74. The subtracter 74 then outputs the difference, which is a counterclockwise difference, or a difference in the moving direction on the Lissajous. Similarly, a subtracter 75 subtracts the data value of the last sampling session from that of the current sampling session and outputs the difference as clockwise difference. The output of the subtracter 74 is applied to one of the input terminals of comparator 76 and compared with the maximum differential value applied to the other input terminal. If the output is greater than the maximum differential value, the comparator 76 outputs a high level signal to turn on one of the input terminals of AND circuit 84.

Similarly, the output of the subtracter 75 is applied to one of the input terminals of comparator 82 and compared with the maximum differential value applied to the other input terminal. If the signal of the differential value from the subtracter 75 is greater than the maximum differential value, the comparator 82 outputs a high level signal to turn on the other input terminal of the AND circuit 84. Then, the AND circuit 84 outputs an error signal.

If, on the other hand, the outputs of the subtracters 74, 75 do not exceed the maximum difference value, the comparators 76, 82 respectively output low level signals so that the outputs of AND circuits 78, 79 are made active and hence OR circuit 80 outputs the differential value from its output terminal 81. At this time, the output of the comparator 82 indicates a clockwise difference, which is them output from the output terminal 83 to indicate the right direction.

Figure 20:
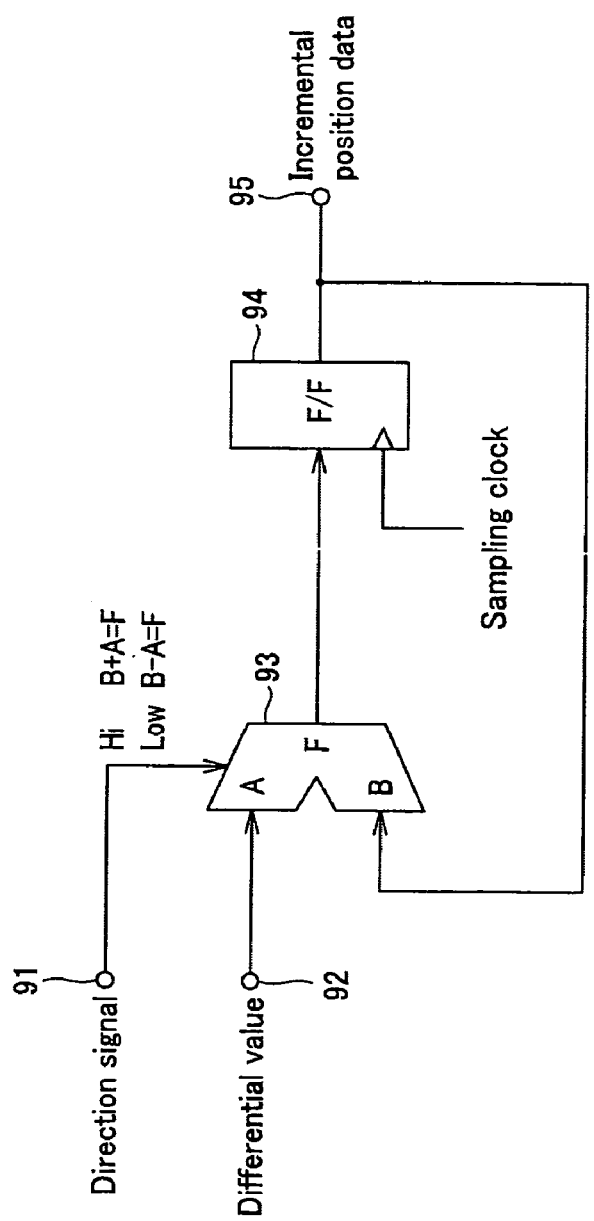
FIG. 20 is a schematic circuit diagram of an adder that can be used for the first embodiment of FIG. 5.

Now, a specific example of the addition circuit 13 in FIG. 5 will be described. FIG. 20 is a circuit diagram of an adding circuit that can be used for the circuit 13. Referring to FIG. 20, the differential value output from the differential computer and supplied to terminal 92 is input to adder 93 according to the directional signal applied to input terminal 91 and added accumulatively to the value of the last sampling session that is set in flip-flop 94. Then, incremental positional information $D_{ink}$ is obtained from output terminal 95.

The processing circuit 9 may have a configuration similar to the one described above. The configurations of the processing circuits 8 and 9 are not limited to the above described ones that employ a lookup table by referring to FIGS. 11 through 20. Configurations adapted to computational operations using arctangent $\tan^{-1} \theta$ may alternatively be for the processing circuits 8 and 9.

In the arrangement illustrated in FIG. 11, a correction circuit and a digital filter may be inserted respectively in front of the quadrant converter 65 and in front of the differential computer 68. With such an arrangement, it is possible to improve the accuracy of detection of differential values of both the processing circuit 8 and the processing circuit 9.

As described above, the displacement detection apparatus of the first embodiment uses scales 4, each of which carries a reflection type or transmission type diffraction grating that is prepared typically by means of a hologram. The diffraction grating shows a profile of a thin plate on the surface of which narrow slits or grooves are cut at predetermined intervals, or at a predetermined pitch, to produce a grating with distributed refractive indexes.

Optical heads that are light emitting/receiving composite units as shown in FIGS. 9 and 10 are used for the head 1 and the head 2.

Figure 21A:
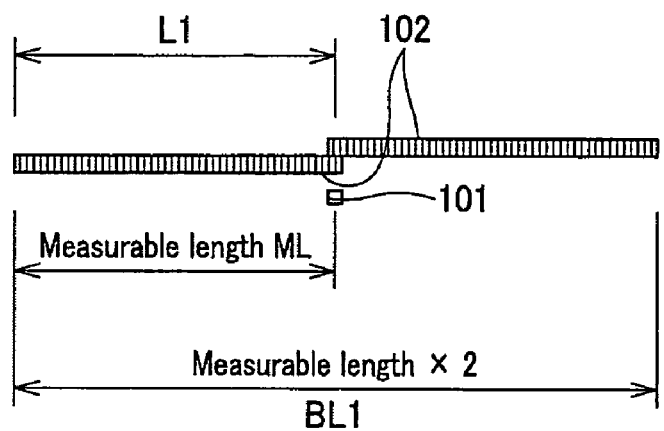
FIGS. 21A and 21B are schematic illustrations of the advantages of the first embodiment relative to a known displacement detection apparatus.
Figure 21B:
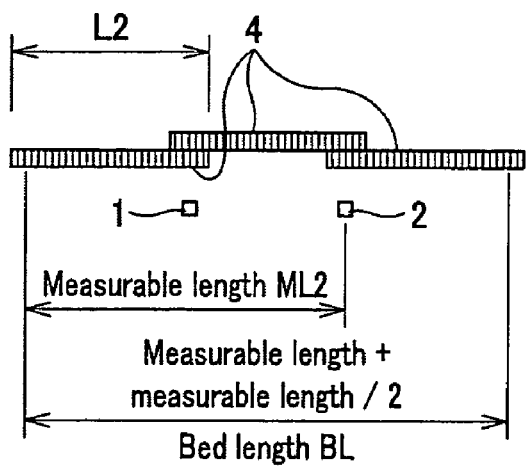

As seen from FIGS. 21A and 21B, each of the scale 4 of this embodiment has a length that is only about a half of the length L1 of a conventional scale 102 to show a relationship of L2=½·L1. On the other hand, the measurable length ML1 and the measurable length ML2 are equal to each other and the bed length BL2 is shorter than the bed length BL1. Thus, while the length BL1 of the bed, which is a stationary section, of the conventional displacement detection apparatus using scales 102 is twice as long as the measurable length ML1, the length BL2 of the bed, which is a stationary section, of this embodiment is only the measurable length ML2+(measurable length ML2/2).

Therefore, while the displacement detection apparatus of FIG. 5 comprises two heads as compared with the conventional apparatus comprising only a single scale and a single head, the scales 4 of the apparatus of FIG. 5 are far shorter than the scale of the conventional apparatus. In other words, the scales 4 are lightweight and can be manufactured at low cost. Additionally, they are less liable to be stained by dirt and dust. Furthermore, they can be manufactured and handled with ease. The bed can be made short.

Still additionally, since both the processing circuit 8 and the processing circuit 9 use a same high speed clock, the positional data and the differential value of the former and those of the latter are produced simultaneously so that switching errors can hardly arise when incremental positional information $D_{ink}$ are generated. Finally, since the resolution of positional data and difference values is made sufficiently higher than the resolution of displacement quantities in incremental data, switching errors can be reduced further.

Figure 22:
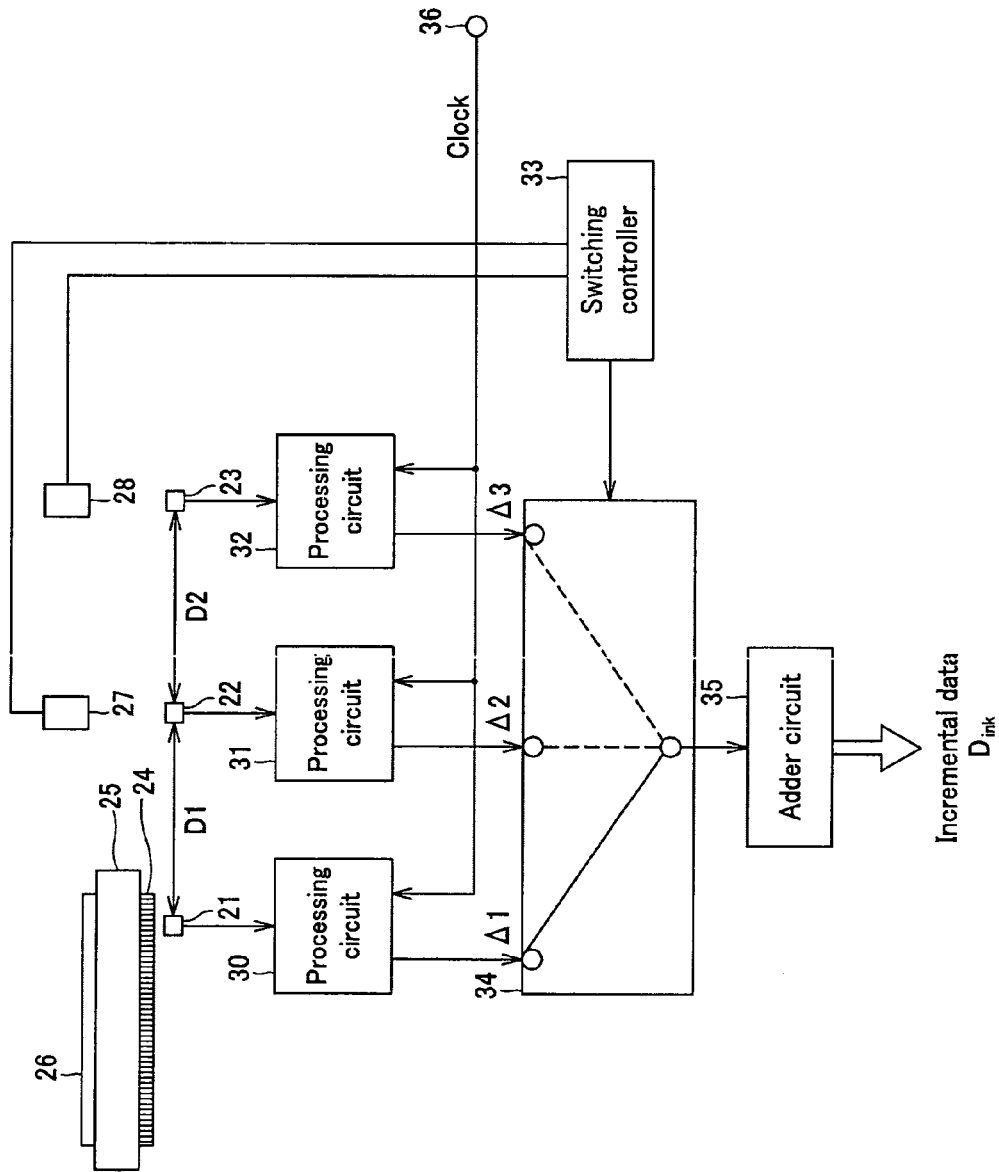
FIG. 22 is a schematic block diagram of the second embodiment of displacement detection apparatus according to the invention.

FIG. 22 is a schematic block diagram of the second embodiment of displacement detection apparatus according to the invention. FIGS. 23A through 23D are schematic illustrations of the relative positional relationship of the single scale and the three heads of the second embodiment of FIG. 22. As shown in FIGS. 22 through 23D, the second embodiment comprises a single scale 24, three heads 21, 22 and 23 and switch sensors 27 and 28 and is adapted to detect the quantity of movement of a linear stage 5 and operate for feedback servo control. Like the first embodiment, the second embodiment is a displacement detection apparatus that can typically be used in the field of manufacturing semiconductors or liquid crystals for the purpose of measuring a quantity of movement in the order of nanometers (nm).

The three heads 21, 22 and 23 of the displacement detection apparatus are arranged on a bed (the bed 29 in FIGS. 23A through 23D), which is a stationary section, opposite to a scale 24 and separated from each other by a predetermined gaps D1 and D2 respectively. The scale 24 is, on the other hand, fitted to a table 25 along the longitudinal direction of the latter, which is a movable section and adapted to linearly move from left L to right R in the direction indicated by arrow A or from right R to left L in the direction indicated by arrow B, so as to be vis-à-vis the heads 21, 22 and 23.

Like the scale 4 of the first embodiment, the scale 24 is produced by preparing a reflection type or transmission type diffraction grating typically by means of a hologram and adapted to operate with a resolution of the order of nm as a result of resolving the obtained sine wave. The diffraction grating to be used for the scale 24 typically is in the form of a thin plate, on the surface of which narrow slits or grooves are cut at predetermined intervals, or at a predetermined pitch, to produce a grating with distributed refractive indexes. However, the type of diffraction grating to be used for the scale 24 is not limited to the above described one, or the type having mechanically cut grooves. For example, a diffraction grating may be formed on a plate of photosensitive resin by means of interference fringes obtained by baking.

Note that, like the scale 4, the scale 24 is formed by cutting graduations typically at a pitch of 4 μm or 138 nm on a thin plate of glass for the diffraction grating. As a matter of fact, it is easy to prepare and handle a short scale rather than a long scale. Additionally, a long scale is costly. A short scale is less liable to be stained by dirt and dust. For these reasons, it is preferable to use a short scale rather than a long scale for the scale 24. Still additionally, it is possible to realize a compact apparatus by using a short scale.

Since the scale 24 is fitted to the table 25 along the longitudinal direction of the latter, which is adapted to linearly move from left L to right R in the direction indicated by arrow A or from right R to left L in the direction indicated by arrow B, so as to be vis-à-vis the heads 21, 22 and 23, the head 21, the head 22 and the head 23 can be displaced relative to the scale 24.

Figure 24:
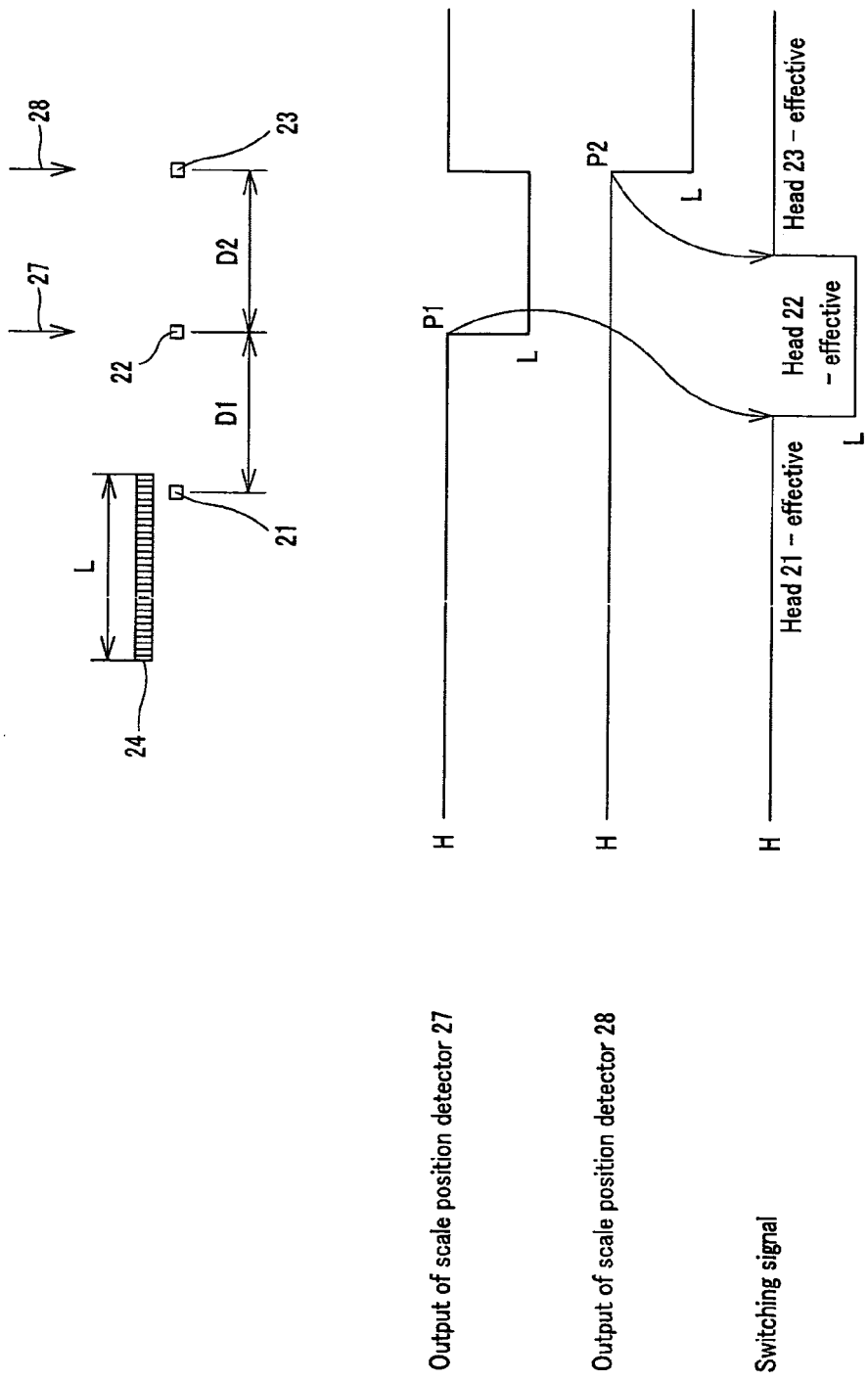
FIG. 24 is a schematic illustration of the relative positions of the single scale and the three heads of the second embodiment of FIG. 22.

FIG. 24 is a schematic illustration of the relative positions of the single scale 24 and the three heads 21, 22 and 23 of the second embodiment of FIG. 22. Since the differential value Δ1, the differential value Δ2 and the differential value Δ3, which will be described in greater detail hereinafter, are selectively used, the two gaps separating any two adjacent ones of the three heads 21, 22 and 23 (the gap D1 between the head 21 and the head 22 and the gap D2 between the head 22 and the head 23) are made shorter than the length of the scale 24. Since the head 21, the head 22 and the head 23 are displaceable relative to the scale 24, it is possible to detect periodic analog signals of a plurality of different types as a function of the graduations cut on the scale 24 at a predetermined pitch. As pointed out earlier, a periodic analog signal as used herein may refer to a sine wave sin or a cosine wave cos. Alternatively, it may be a plurality of sine waves sin or cosine waves cos. Optical heads are used for the head 21, the head 22 and the head 23 in this embodiment.

Referring to FIG. 22, the periodic analog signals of a plurality of different types that the head 21 detects from the scale 24 are then supplied to the processing circuit 30. Similarly, the periodic analog signals of a plurality of different types that the head 22 detects from the scale 24 are supplied to the processing circuit 31 and the periodic analog signals of a plurality of different types that the head 23 detects from the scale 24 are supplied to the processing circuit 32.

The processing circuit 30 samples the periodic analog signals in synchronism with the high speed clock of typically 10 MHz or 20 MHz supplied from clock terminal 36. The high speed clock may show any frequency between 10 MHz and 20 MHz.

The processing circuit 30 then detects differential data $\Delta 1$ on the difference between the positional data on the current position, or the current sampling data, and the last positional data on the last position, or the last sampling data. Similarly, the processing circuits 31 and 32 respectively sample the periodic analog signals and then detect differential data $\Delta 2$ and $\Delta 3$ on the difference between the positional data on the current position and the last positional data on the last position, or the last sampling data. The differential data $\Delta 1$, the differential data $\Delta 2$ and the differential data $\Delta 3$ are supplied to switching controller 34.

A same high speed clock is used for the operation of the processing circuit 30 of sampling the periodic analog signals, that of the processing circuit 31 of sampling the periodic analog signals and that of the processing circuit 32 of sampling the periodic analog signals. In other words, their respective positional data and differential values are of a same clock time. This means that errors can hardly occur by switching if incremental positional information $D_{ink}$ is used by adding the differential value of the head that is selected as a function of the state of an external switching detector, which will be described in greater detail hereinafter.

The switching controller 34 selectively employs the differential data $\Delta 1$ detected by the processing circuit 30, the differential data $\Delta 2$ detected by the processing circuit 31 and the differential data $\Delta 3$ detected by the processing unit 32 in a switched manner. More specifically, the switching controller 34 selectively employs the differential data $\Delta 1$, the differential data $\Delta 2$ or the differential data $\Delta 3$ according to the control operation of the switching controller 33. The switching controller 33 controls the switching operation of the switching controller 34 according to the detection output of scale position detector 27 and that of scale position detector 28, which operate to detect that the scale 24 has reached to a predetermined position relative to the head 21, the head 22 and the head 23.

Like the scale position detector 7 of the first embodiment, the scale position detector 27 and the scale position detector 28 are typically formed by using a photoelectric switch. Each of them is adapted to output "L" when light emitted from the light emitting side thereof is blocked by a light shield plate 26 having a length exactly same as the scale 24 and arranged on the table 25 in FIG. 22 before it gets to the light receiving side thereof but output "H" when light emitted from the light emitting side is not blocked.

FIG. 24 also shows a switching signal to be used by the switching controller 34 to selectively use one of the differential data $\Delta 1$, the differential data $\Delta 2$ and the differential data $\Delta 3$ as effective data according to the detection output of the scale position detector 27 and that of the scale position detector 28.

Figure 23A:
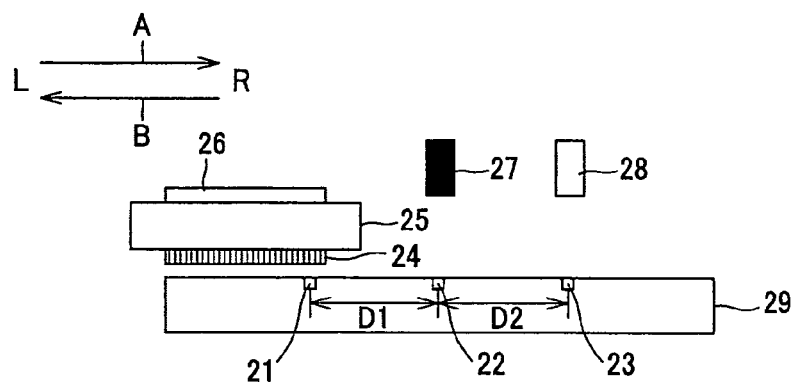
FIGS. 23A through 23D are schematic illustrations of the relative positional relationship of the single scale and the three heads of the second embodiment of FIG. 22.

The scale position detector 27 outputs "H" when light emitted from the light emitting side to the light receiving side is not blocked by the light shield plate 26, or when the state of FIG. 23A is present. The scale position detector 27 outputs "L" when light emitted from the light emitting side to the light receiving side is blocked by the light shield plate 26, or when the state of FIG. 23B is present.

Figure 23B:
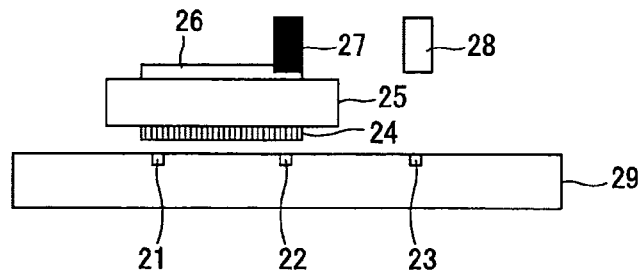

When the scale 24 is in the position of FIG. 23B, the scale position detector 27 is anchored to the stationary part of the apparatus so that emitted light is blocked by the light shield plate 26. Therefore, the scale position detector 27 mechanically accurately detects the time when the head 21 and the head 22 that are separated from each other by the gap D1 that is smaller than the length of the scale 24 are at the respective positions of FIG. 23B. In other words, it can detect the transitional time point P1 when the output of the scale position detector 27 changes from "H" to "L" as shown in FIG. 24 with an enhanced level of reproducibility. The transitional time point P1 is accurately detected by the switching controller 33.

At this time, the switching controller 33 supplies a switching signal as shown in FIG. 24 to the switching controller 34. As a result, the switching controller 34 can selectively switch from the differential data $\Delta 1$ detected by the processing circuit 30 to the differential data $\Delta 2$ detected by the processing circuit 31 or vice versa and output it to the addition circuit 35.

The scale position detector 28 outputs "H" when light emitted from the light emitting side to the light receiving side is not blocked by the light shield plate 26, or when the state of FIG. 23A and that of FIG. 23B are present. The scale position detector 28 outputs "L" when light emitted from the light emitting side to the light receiving side is blocked by the light shield plate 26, or when the state of FIG. 23C is present.

Figure 23C:
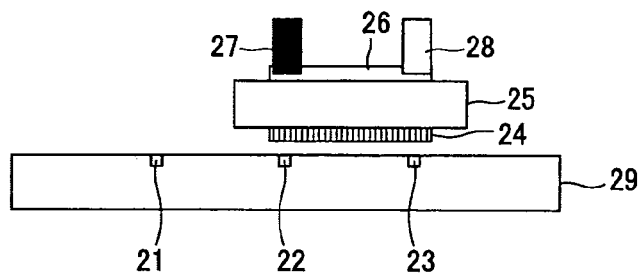
Figure 23D:
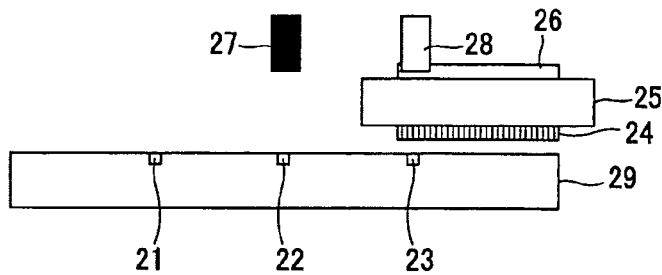

When the scale 24 is in the position of FIG. 23C, the scale position detector 28 is anchored to the stationary part of the apparatus so that emitted light is blocked by the light shield plate 26. Therefore, the scale position detector 28 mechanically accurately detects the time when the head 22 and the head 23 that are separated from each other by the gap D2 that is smaller than the length of the scale 24 are at the respective positions of FIG. 23C. In other words, it can detect the transitional time point P2 when the output of the scale position detector 28 changes from "H" to "L" as shown in FIG. 24 with an enhanced level of reproducibility. The transitional time point P2 is accurately detected by the switching controller 33.

At this time, the switching controller 33 supplies a switching signal as shown in FIG. 24 to the switching controller 34. As a result, the switching controller 34 can selectively switch from the differential data $\Delta 2$ detected by the processing circuit 31 to the differential data $\Delta 3$ detected by the processing circuit 32 or vice versa and output it to the addition circuit 35.

Now, the operation of the second embodiment will be described in greater detail below. FIG. 23B illustrates a state where both the head 21 and the head 22 output periodic analog signals respectively to the processing circuit 30 and the processing circuit 31. At this time, the processing circuit 30 and the processing circuit 31 respectively output the differential data $\Delta 1$ and the differential data $\Delta 2$ to the switching controller 34.

As described above, the scale position detector 27 supplies "H" to the switching controller 33 when light emitted from the light emitting side is received by the light receiving side without being blocked by the light shield plate 26. Therefore, when the scale 24 is moved in the direction of arrow A from the state as illustrated in FIG. 23A to the state as illustrated in FIG. 23B, the scale position detector 27 outputs "H" for a predetermined period of time as shown in FIG. 24 and then outputs "L".

As the scale 24 is moved further in the direction of arrow A, the scale position detector 27 continuously outputs "L" for a predetermined period of time as shown in FIG. 24 until the scale 24 comes into the state as illustrated in FIG. 23C. The predetermined period of time is determined as a function of the length and the moving speed of the scale 24. Therefore, once the scale 24 starts moving in the direction of arrow A as shown in FIG. 23A, the switching controller 33 can detect when the scale 24 comes into the state of FIG. 23B and also when the scale 24 comes into the state of FIG. 23C. It is also possible to detect the moving direction of the scale 24 by detecting the sequence according to which the scale position detector 27 outputs "H" and "L" for a predetermined period of time.

Similarly, the scale position detector 28 supplies "H" to the switching controller 33 when light emitted from the light emitting side is received by the light receiving side without being blocked by the light shield plate 26. Therefore, when the scale 24 is moved in the direction of arrow A from the state as illustrated in FIG. 23A to the state as illustrated in FIG. 23C, the scale position detector 28 outputs "H" for a predetermined period of time as shown in FIG. 24 and then outputs "L".

As the scale 24 is moved further in the direction of arrow A, the scale position detector 28 continuously outputs "L" for a predetermined period of time as shown in FIG. 24 until the scale 24 comes into the state as illustrated in FIG. 23D from the state as illustrated in FIG. 23C. The predetermined period of time is determined as a function of the length and the moving speed of the scale 24. Therefore, once the scale 24 starts moving in the direction of arrow A as shown in FIG. 23A, the switching controller 33 can detect when the scale 24 comes into the state of FIG. 23B and also when the scale 24 comes into the state of FIG. 23C. It is also possible to detect the moving direction of the scale 24 by detecting the sequence according to which the scale position detector 28 outputs "H" and "L" for a predetermined period of time.

In this way, when the scale 24 moves in the direction of arrow A, the head 21 is made to operate effectively from the state of FIG. 23A to the state of FIG. 23B and hence the differential value Δ1 from the processing circuit 30 is supplied to the adder circuit 35. When the state of FIG. 23B becomes present, the head 22 is made to operate effectively and hence the differential value Δ2 from the processing circuit 31 is supplied to the adder circuit 35. When, finally, the state of FIG. 23B moves to the state of FIG. 23C while the head 22 is made effective, the head 23 is made effective until the state of FIG. 23D becomes present.

The adder circuit 35 adds the differential value Δ1, the differential value Δ2 or the differential value Δ3 that is selected and output by the switching controller 33 in a switched manner to the corresponding preceding differential value and outputs incremental positional information $D_{ink}$.

An optical head as shown in FIGS. 9 and 10 may be used for each of the heads 21 through 23, although some other appropriate head may alternatively be used. While each of the processing circuits 30 through 32 may be configured so as to use a lookup table as described above by referring to FIGS. 11 through 20, the processing circuits 30 through 32 may be configured in a different way. While a circuit as shown in FIG. 20 is used for the addition circuit 35, it may alternatively have a different configuration.

As described above, the displacement detection apparatus of the second embodiment uses scales 24, each of which carries a reflection type or transmission type diffraction grating that is prepared typically by means of a hologram. The diffraction grating shows a profile of a thin plate on the surface of which narrow slits or grooves are cut at predetermined intervals, or at a predetermined pitch, to produce a grating with distributed refractive indexes.

Each of the scales 24 of the second embodiment has a length that is only about a half of the length L1 of a conventional scale 102. On the other hand, the measurable length ML of this embodiment is made to be equal to one and a half times of that of the conventional apparatus because of the use of three heads 21, 22 and 23. In other words, the bed length of this embodiment is shorter than that of the conventional apparatus.

Therefore, while the displacement detection apparatus of FIG. 22 comprises three heads as compared with the conventional apparatus comprising only a single scale and a single head, the scales 24 of the apparatus of FIG. 22 are far shorter than the scale of the conventional apparatus but the measurable length of the apparatus is far longer than that of the conventional apparatus. In other words, the scales 24 are lightweight and can be manufactured at low cost. Additionally, they are less liable to be stained by dirt and dust so that the reliability of the apparatus can be improved. Furthermore, they can be manufactured and handled with ease. The bed can be made short.

Still additionally, since all the processing circuits 30, the processing circuit 31 and the processing circuit 32 use a same high speed clock, the positional data and the differential value of the former and those of the latter are produced simultaneously so that switching errors can hardly arise when incremental positional information are generated. Finally, since the resolution of positional data is made sufficiently higher than the resolution of incremental data, switching errors can be reduced further.

While three heads are used in this embodiment, it is possible to use four, five, six or more than six heads provided that the length of any two adjacently located heads is shorter than the length of the scale 24. It may be needless to say that two adjacently located heads detect if the scale 24 has reached a predetermined position or not.

Figure 25:
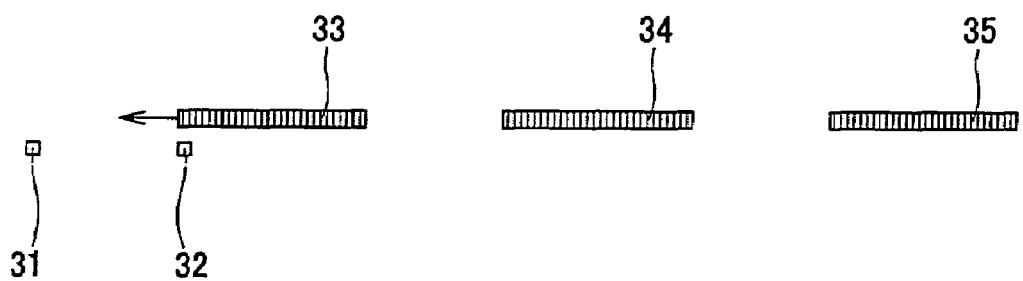
FIG. 25 is a schematic illustration of the relationship of the two heads separated from each other and the three scales also separated from each other that are used in the third embodiment of displacement detection apparatus according to the invention.

Now, the third embodiment of the invention will be described by referring to FIG. 25 and FIGS. 26A through 26G. FIG. 25 is a schematic illustration of the relationship of the two heads 31 and 32 separated from each other and the three scales 33, 34 and 35 also separated from each other that are used in the third embodiment of displacement detection apparatus according to the invention. FIGS. 26A through 26G are schematic time-series illustrations of the changing state of the three scales 33, 34 and 35 separated from each other and fitted to a table 37 that is movable relative to the two heads 31 and 32 fitted to a stationary bed 36. They show how the scale position detector 41 detects the position of each of the scales as the state of the scales 33, 34 and 35 changes and the beams of light are blocked by the light shield plates 38, 39 and 40 having a length same as that of the scales 33, 34, and 35.

The three scales 33, 34 and 35 illustrated in FIG. 25 have a same length and therefore they provide a same measurable length L. Two adjacent heads are separated from each other by a gap D that is smaller than the measurable length L of the scale (D<L). Any two of the scales 33, 34, and 35 that are adjacently located are separated from each other by a gap d smaller than the gap D separating two adjacently located heads (d<D). In short, both the gap D separating any two adjacently located heads and the gap d separating any two adjacently located scales are made smaller than the length L of a scale. Additionally, the gap d of the adjacently located scales is made shorter than the gap D of the adjacently located heads. Therefore, the heads can continuously output effective signals as the two heads 31 and 32 are selectively used according to the detection output of the scale position detector 41 shown in FIGS. 26A through 26G.

As in the case of the first embodiment of displacement detection apparatus described earlier by referring to FIG. 5, the periodic analog signals of a plurality of different types that the head 31 detects are then supplied to the processing circuit 8 and, similarly, the periodic analog signals of a plurality of different types that the head 32 detects are supplied to the processing circuit 9. The configuration of the processing circuit 8 and that of the processing circuit 9 are already described by referring to FIG. 5 so that they will not be described here any further. Note, however, that the switching controller 12 shown in FIG. 5 controls the switching operation of the changeover switch 11 according to the detection output of the scale position detector 41.

The scale position detector 41 is typically formed by using a photoelectric switch and adapted to output "L" when light emitted from the light emitting side thereof is blocked before it gets to the light receiving side thereof but output "H" when light emitted from the light emitting side is not blocked. The light shield plates 38, 39 and 40 having a length exactly same as the length L of the scales 33, 34 and 35 and arranged on the table 37 and separated from each other by the gap d are adapted to block light emitted from the light emitting side as the table 37 moves.

Figure 26A:
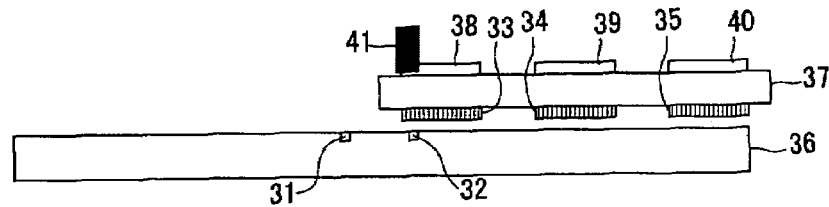
FIGS. 26A through 26G are schematic illustrations of the changing state of the three scales separated from each other and fitted to a table that is movable relative to the two head fitted to a stationary bed.
Figure 26B:
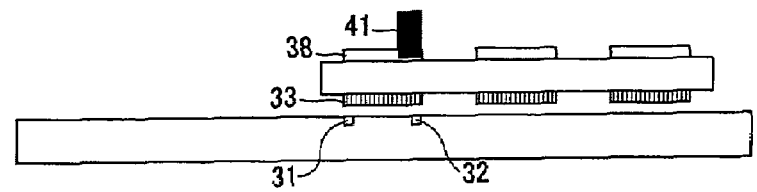
Figure 26C:
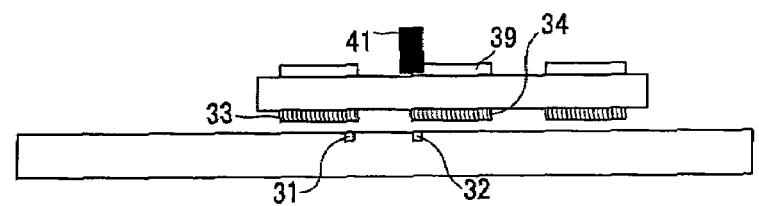
Figure 26D:
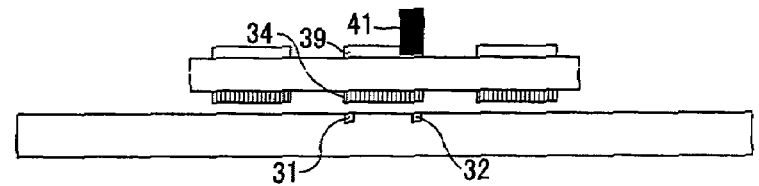
Figure 26E:
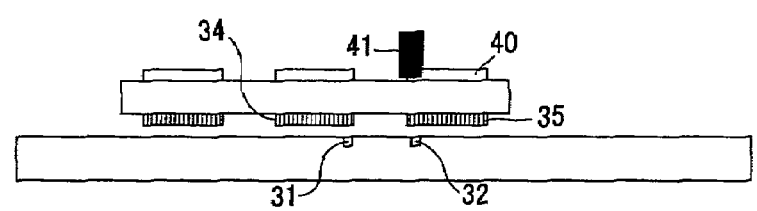
Figure 26F:
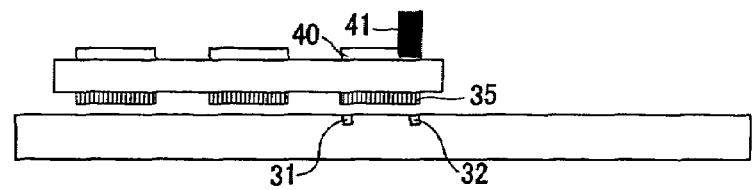
Figure 26G:
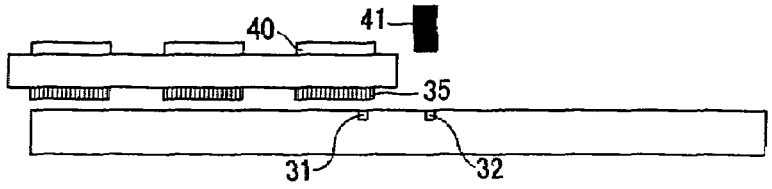

The scale position detector 41 is rigidly fitted to the stationary section of the apparatus in such a way that light coming from the light emitting side is blocked by one of the light shield plates 38, 39, 40 when the scale 33 is at a position between the two positions illustrated respectively in FIGS. 26A and 26B, when the scale 34 is at a position between the two positions illustrated respectively in FIGS. 26C and 26D or when the scale 35 is at a position between the two positions illustrated respectively in FIGS. 26E and 26F.

Therefore, the scale position detector 41 mechanically accurately detects the time when the table 37 is moved from its right marginal position as shown in FIG. 26A in the direction as indicated by arrow B and the head 31 and the head 32 that are separated from each other by a gap D smaller than the length L of the scales 33, 34 and 35 are at respective positions relative to the scales 33, 34 and 35 as illustrated in FIGS. 26B, 26D and 26F. In other words, it can detect the transitional time point when the detection output of the scale position detector 41 changes from "L" to "H" with an enhanced level of reproducibility. The transitional time point is detected by the switching controller 12.

At this time, the switching controller 12 supplies a switching signal to the changeover switch 11. As a result, the changeover switch 11 can selectively switch from the differential data Δ1 detected by the processing circuit 8 to the differential data Δ2 detected by the processing circuit 9 or vice versa according to the detection output of the scale position detector 41.

Now, the operation of the third embodiment will be described in greater detail below. FIG. 26B illustrates a state where both the head 31 and the head 32 output periodic analog signals respectively to the processing circuit 8 and the processing circuit 9. At this time, the processing circuit 8 and the processing circuit 9 respectively output the differential data Δ1 and the differential data Δ2 to the changeover switch 11.

As described above, the scale position detector 41 supplies "H" to the switching controller 12 when light emitted from the light emitting side is received by the light receiving side without being blocked by any of the light shield plates 38, 39 and 40 but supplies "L" to the switching controller 12 when light emitted from the light emitting side is blocked. Therefore, for example, when the scale 33 is moved in the direction of arrow B from the state as illustrated in FIG. 23A to the state as illustrated in FIG. 26B, the scale position detector 41 outputs "L" for a predetermined period of time.

As the scale 33 is moved further with the table 37 in the direction of arrow B from the state of FIG. 26B, the scale position detector 41 outputs "H" for a predetermined period of time that corresponds to the gap d between the scale 33 and the scale 34 until the scale 33 comes into the state as illustrated in FIG. 26C. The predetermined period of time is determined as a function of the distance d between the scale 33 and the scale 34 and the moving speed of the scales. Therefore, once the table 37 starts moving in the direction of arrow B as shown in FIG. 26A, the switching controller 12 can detect when the state of FIG. 26B becomes present and also when the state of FIG. 26C becomes present. It is also possible to detect the moving direction of the table 37 by detecting the sequence according to which the scale position detector 41 outputs "L" and "H" for a predetermined period of time.

Since the switching controller 12 can also detect the timing of the change from "L" to "H" when the scale 34 moves with the table 37 from the state of FIG. 26C to the state of FIG. 26D and also when the scale 35 moves from the state of FIG. 26E to the state of FIG. 26F, it can detect the time when the state of FIG. 26D arises and also the time when the state of FIG. 26F arises. It is also possible to detect the moving direction of the table 37 by detecting the sequence according to which the scale position detector 41 outputs "L" and "H" for a predetermined period of time.

When the scale 33 is in the state of FIG. 26A when it starts moving in the direction of arrow B, only the head 32 detects periodic analog signals of a plurality of different types. Therefore, only the processing circuit 9 detects the differential value Δ2 and supplies it to the changeover switch 11. At this time, the switching controller 12 generates a switching signal according to "L" that the scale position detector 41 outputs and supplies it to the changeover switch 11. The changeover switch 11 selects the differential value Δ2 from the processing circuit 9 and supplies it to the downstream addition circuit 13.

As the scale 33 is moved further in the direction of arrow B and comes into the state of FIG. 26B, both the head 32 and the head 31 output periodic analog signals respectively to the processing circuit 9 and the processing circuit 8. Then, the processing circuit 9 and the processing circuit 8 outputs respectively the differential data Δ2 and the differential data Δ1 to the changeover switch 11. At this time, the scale position detector 41 outputs "L" for a predetermined period of time and then "H" also for a predetermined period of time. As the switching controller 12 detects the transitional time point P, when "L" is switched to "H", it supplies a switching signal to the changeover switch 11 for the change from "L" to "H". Then, the changeover switch 11 selects the differential value Δ1 from the processing circuit 8 and supplies it to the addition circuit 13.

Subsequently, only the head 31 detects periodic analog signals of a plurality of different types until the scale 33 comes into the state of FIG. 26C as it is moved further in the direction of arrow B. Thus, only the processing circuit 8 detects the differential value Δ1 and supplies it to the changeover switch 11. Since the changeover switch 11 is already turned to the side of the processing circuit 8 in the state of FIG. 26B, the differential value Δ1 is continuously supplied to the addition circuit 13.

In this way, as the scale 33 is moved in the direction of arrow B, the head 32 is made active between the state of FIG. 26A and the state of FIG. 26B so that consequently the processing circuit 9 supplies the differential value Δ2 to the addition circuit 13. When the scale 33 comes into the state of FIG. 26B, the head 31 is activated so that consequently the processing circuit 8 supplies the differential value Δ1 to the addition circuit 13.

As the table 37 is moved in the direction of arrow B, the scale position detector 41 switches its detection output from "H" to "L". As the switching controller 12 detects the transitional time point, when "H" is switched to "L", it supplies a switching signal to make the changeover switch 11 switch from the differential value Δ1 and select the differential value Δ2. In other words, it switches the activated head from the head 31 to the head 32. Since the distance D between the head 31 and the head 32 is greater than the distance between the scale 33 and the scale 34, the switch from the differential value Δ1 to the differential value Δ2 takes place without any interruption.

Subsequently, only the head 32 detects periodic analog signals of a plurality of different types as the scale 34 starts moving in the direction of arrow B. Thus, only the processing circuit 9 detects the differential value Δ2 and supplies it to the changeover switch 11. At this time, the switching controller 12 generates a switching signal according to "L" output from the scale position detector 41 and supplies it to the changeover switch 11. The changeover switch 11 then selects the differential value Δ2 from the processing circuit 9 and supplies it to the downstream addition circuit 13.

As the scale 34 is moved further in the direction of arrow B and comes into the state of FIG. 26D, both the head 32 and the head 31 output periodic analog signals respectively to the processing circuit 9 and the processing circuit 8. Then, the processing circuit 9 and the processing circuit 8 output respectively the differential data Δ2 and the differential data Δ1 to the changeover switch 11. As the scale 34 is moved further from the state of FIG. 26D in the direction of arrow B, the scale position detector 41 is driven to output "L" for a predetermined period of time and then "H" also for a predetermined period of time. As the switching controller 12 detects the transitional time point P, when "L" is switched to "H", it supplies a switching signal to the changeover switch 11 for the change from "L" to "H". Then, the changeover switch 11 selects the differential value Δ1 from the processing circuit 8 and supplies it to the addition circuit 13.

Subsequently, only the head 31 detects periodic analog signals of a plurality of different types until the scale 34 comes into the state of FIG. 26E as it is moved further in the direction of arrow B. Thus, only the processing circuit 8 detects the differential value Δ1 and supplies it to the changeover switch 11. Since the changeover switch 11 is already turned to the side of the processing circuit 8 in the state of FIG. 26D, the differential value Δ1 is continuously supplied to the addition circuit 13.

In this way, as the scale 34 is moved in the direction of arrow B, the head 32 is made active between the state of FIG. 26C and the state of FIG. 26D so that consequently the processing circuit 9 supplies the differential value Δ2 to the addition circuit 13. When the scale 34 comes into the state of FIG. 26D, the head 31 is activated so that consequently the processing circuit 8 supplies the differential value Δ1 to the addition circuit 13.

The operation of switching from the head 31 to the head 32 and vice versa when the scale 35 is moved in the direction of arrow B from the state of FIG. 26E to the state of FIG. 26F is similar to the above described operation of switching from the scale 33 to the scale 34 and vice versa. Then, as "H" is detected at the time when the state of FIG. 26G arises, the displacement detection apparatus detects that the table 37 has come to its left marginal position.

As described above, the displacement detection apparatus of the third embodiment uses scales 33 through 35, each of which carries a reflection type or transmission type diffraction grating that is prepared typically by means of a hologram. The diffraction grating shows a profile of a thin plate on the surface of which narrow slits or grooves are cut at predetermined intervals, or at a predetermined pitch, to produce a grating with distributed refractive indexes.

Each of the scales 33 through 35 of the third embodiment has a length that is only about ⅓ of the length L1 of a conventional scale 102. On the other hand, the measurable length of this embodiment is made to be longer than that of the conventional apparatus because of the use of two heads 31 and 32. In other words, the bed length of this embodiment is shorter than that of the conventional apparatus.

Therefore, the scales of the third embodiment can be handled and manufactured with ease. Additionally, the bed can be made short.

Still additionally, since both of the processing circuits use a same high speed clock, the positional data and the differential value of the former and those of the latter are produced simultaneously so that switching errors can hardly arise when incremental positional information $D_{ink}$ are generated. Finally, since the resolution of positional data is made sufficiently higher than the resolution of incremental data, switching errors can be reduced further.

Figure 27:
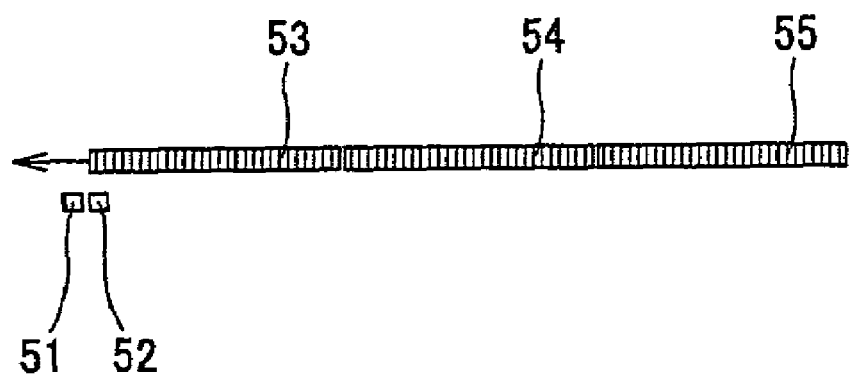
FIG. 27 is a schematic illustration of the relative positional relationship of the two heads and the three scales of the fourth embodiment according to the invention.

Now, the fourth embodiment of the invention will be described by referring to FIG. 27. FIG. 27 is a schematic illustration of the relationship of the two heads 51 and 52 and the three scales 53, 54 and 55 that are used in the fourth embodiment of displacement detection apparatus according to the invention. As shown in FIG. 27, the gap separating any two adjacently located scales and also the gap separating any two adjacently located heads are made short in the fourth embodiment. Due to the reduced gaps, the heads are less liable to be affected by the ambient temperatures. The scales are also less liable to be affected by the ambient temperatures regardless of the locations where they are arranged. As a result, it is possible to further reduce errors.

While the changeover switch 11 selectively adopts a differential value according to the detection output of the scale position detector 7 in each of the above-described embodiments, the present invention is by no means limited thereto. For example, it may selectively adopt a differential value according to a signal prepared from the incremental data.

It should be understood by those skilled in the art that various modifications, combinations, sub-combinations and alterations may occur depending on design requirements and other factors insofar as they are within the scope of the appended claims or the equivalents thereof.

What is claimed is:

1. A displacement detection apparatus comprising:
    a scale having graduations arranged at a predetermined pitch;
    a first head adapted to detect periodic analog signals corresponding to the predetermined pitch;
    a second head adapted to detect periodic analog signals corresponding to the predetermined pitch;

first processing means for detecting a first differential value between an immediately preceding positional data and a current positional data obtained by sampling the periodic analog signals detected by the first head;

second processing means for detecting a second differential value between an immediately preceding positional data and a current positional data obtained by sampling the periodic analog signals detected by the second head;

switching means for selectively providing an output corresponding to the first differential value detected by the first processing means or the second differential value detected by the second processing means;

scale position detection means for detecting when the scale reaches a predetermined position relative to the first head or a predetermined position relative to the second head;

switching control means for causing the switching means to switch in response to a signal received from the scale position detection means; and means for outputting positional information based on the provided output.

2. The apparatus according to claim 1, wherein the first head and the second head are separated from each other by a gap smaller than the length of the scale.

3. The apparatus according to claim 2, wherein, when the scale position detection means detects the scale getting to the predetermined position relative to the first head and the second head, the first processing means and the second processing means, respectively, detect the first differential value and the second differential value.

4. A displacement detection apparatus comprising:
a scale carrying graduations arranged at a predetermined pitch;
three or more heads adapted to detect periodic analog signals corresponding to the predetermined pitch;
three or more processing means connected respectively to the three or more heads for detecting, respectively, differential values between an immediately preceding positional data and a current positional data obtained by sampling the periodic analog signals detected by the heads;
switching means for selectively providing an output from one of the differential values detected by the three or more processing means;
scale position detection means for detecting when the scale reaches a predetermined position relative to at least two of the three or more heads;
switching control means for causing the switching means to switch in response to a signal received from the scale position detection means; and
means for outputting positional information based on the selected output.

5. The apparatus according to claim 4, wherein any adjacent two of the three heads are separated from each other by a gap smaller than the length of the scale.

6. The apparatus according to claim 5, wherein, when the scale position detection means detects the scale reaching the predetermined position relative to the adjacently located two heads, the second processing means is utilized to detect the respective differential values.

7. A displacement detection apparatus comprising:
a plurality of scales each carrying graduations arranged at a predetermined pitch;
a plurality of heads adapted to detect periodic analog signals corresponding to the predetermined pitch;
a plurality of processing means connected respectively to the plurality of heads for detecting respectively differential values between an immediately preceding positional data and a current positional data obtained by sampling the periodic analog signals detected by the respective heads;
switching means for selectively providing an output detected by the plurality of processing means;
scale position detection means for detecting when one of the plurality of scales reaches a predetermined position relative to at least two of the plurality of heads;
switching control means for causing the switching means to switch in response to a signal received from the scale position detection means; and
means for outputting positional information based on the selected output.

8. The apparatus according to claim 7, wherein each of the plurality of scales has a same measurable length and any adjacent two of the plurality of heads are separated from each other by a gap smaller than the measurable length of the scales.

9. The apparatus according to claim 8, wherein, when the scale position detection means detects one of the scales reaching the predetermined position relative to the two heads, the same two processing means are utilized to detect the respective differential values.

10. The apparatus according to claim 8, wherein any adjacent two of the plurality of scales are separated from each other by a gap smaller than the gap separating any adjacent two heads.

11. A displacement detection apparatus comprising:
a scale carrying graduations arranged at a predetermined pitch;
a first head adapted to detect periodic analog signals corresponding to the predetermined pitch;
a second head adapted to detect periodic analog signals corresponding to the predetermined pitch;
a first processing section that detects a first differential value between an immediately preceding positional data and a current positional data obtained by sampling the periodic analog signals detected by the first head;
a second processing section that detects a second differential value between an immediately preceding positional data and a current positional data obtained by sampling the periodic analog signals detected by the second head;
a switching section that selectively switches an output from the first differential value detected by the first processing section and the second differential value detected by the second processing section;
a scale position detection section that detects when the scale reaches a predetermined position relative to the first head or a predetermined position relative to the second head;
a switching control section that causes the switching section to switch in response to a signal received from the scale position detection section; and
an addition section that adds the final differential value to one or more preceding differential values and outputs updated positional information.

12. A displacement detection apparatus comprising:
a scale carrying graduations arranged at a predetermined pitch;
three or more heads adapted to detect periodic analog signals corresponding to the predetermined pitch;
three or more processing sections connected respectively to the three or more heads for detecting respectively differential values between an immediately preceding positional data and a current positional data obtained by sampling the periodic analog signals detected by the respective heads;

a switching section that selectively switches between the differential values detected by the processing sections and outputs a final differential value;

a scale position detection section that detects when the scale reaches a predetermined position relative to at least two of the three or more heads;

a switching control section that causes the switching section to switch in response to a signal received from the scale position detection section; and an addition section that adds the final differential value to one or more preceding differential values and outputs updated positional information.

13. A displacement detection apparatus comprising:

a plurality of scales each carrying graduations arranged at a predetermined pitch;

a plurality of heads adapted to detect periodic analog signals corresponding to the predetermined pitch;

a plurality of processing sections connected respectively to the plurality of heads for detecting respectively differential values between an immediately preceding positional data and a current positional data obtained by sampling the periodic analog signals detected by the respective heads;

a switching section that selectively switches between the differential values of the plurality of processing sections and outputs a final differential value;

a scale position detection section that detects when one of the plurality of scales reaches a predetermined position relative to at least two of the plurality of heads;

a switching control section that causes the switching section to switch in response to a signal received from the scale position detection section; and an addition section that adds the final differential value to one or more preceding differential values and outputs updated positional information.

14. The apparatus according to claim 1, wherein the first and second processing means sample the respective periodic analog signals in synchronism with a predetermined clock.

15. The apparatus according to claim 4, wherein the three or more processing means sample the respective periodic analog signals in synchronism with a predetermined dock.

16. The apparatus according to claim 7, wherein the plurality of processing means sample the respective periodic analog signals in synchronism with a predetermined clock.

17. The apparatus according to claim 11, wherein the first and second processing sections sample the respective periodic analog signals in synchronism with a predetermined clock.

18. The apparatus according to claim 12, wherein the three or more processing sections sample the respective periodic analog signals in synchronism with a predetermined clock.

19. The apparatus according to claim 13, wherein the plurality of processing sections sample the respective periodic analog signals in synchronism with a predetermined clock.

* * * * *